United States Patent [19]

Suzuki et al.

[11] Patent Number: 4,879,480
[45] Date of Patent: Nov. 7, 1989

[54] BICMOS GATE ARRAY

[75] Inventors: Yukio Suzuki, Hinode; Ikuro Masuda; Masahiro Iwamura, both of Hitachi; Shinji Kadono, Fussa; Akiro Uragami, Takasaki; Masayoshi Yoshimura, Maebashi; Toshiaki Matsubara, Takasaki, all of Japan

[73] Assignee: Hitachi, Ltd., Tokyo, Japan

[21] Appl. No.: 240,450

[22] Filed: Sep. 2, 1988

Related U.S. Application Data

[63] Continuation of Ser. No. 102,245, Sep. 28, 1987, abandoned, which is a continuation of Ser. No. 8,467, Jan. 29, 1987, abandoned, which is a continuation of Ser. No. 575,567, Jan. 31, 1984, Pat. No. 4,689,503.

[30] Foreign Application Priority Data

Jan. 31, 1983 [JP] Japan ................................. 58-12711
Jan. 31, 1983 [JP] Japan ................................. 58-12712
Jan. 31, 1983 [JP] Japan ................................. 58-12713

[51] Int. Cl.$^4$ ............................................. H03K 19/01
[52] U.S. Cl. ................................... 307/446; 307/303; 307/465; 307/469
[58] Field of Search ............... 307/443, 446, 451, 454, 307/457–458, 473, 475, 469, 570, 577, 579, 584–585, 246, 264, 270, 303, 272 R, 291, 465; 357/40, 43, 72

[56] References Cited

U.S. PATENT DOCUMENTS 3,879,619 4/1975 Pleshko .......................... 307/446 X
4,161,662 7/1979 Malcolm et al. ..................... 307/465
4,255,672 3/1981 Ohno et al. ....................... 357/45 X
4,301,383 11/1981 Taylor ........................... 307/446 X
4,363,107 12/1982 Ohhashi et al. .................. 307/472 X
4,523,106 6/1985 Tanizawa et al. ................... 307/465

OTHER PUBLICATIONS

Taub and Schilling, Digital Integrated Electronics, pub. by McGraw-Hill Book Co., New York, 1977, pp. 90–91, 98–101, 113–119 and 278–282.
Lin et al., "Complementary MOS-Bipolar Transistor Structure", IEEE Teld, vol. Ed-16, No. 11, Nov. 1969, pp. 945–951.

Primary Examiner—David Hudspeth
Attorney, Agent, or Firm—Antonelli, Terry & Wands

[57] ABSTRACT

In an input level converter for TTL - CMOS level conversion (or other conversion to CMOS) for an internal logic block operating with CMOS levels, an output transistor for executing the charge or discharge of the output capacitance thereof is formed of a bipolar transistor. Thus, the propagation delay times and their capacitance-dependencies of the input level converter can be lessened. Similarly, in an output level converter for CMOS - TTL level conversion (or other conversion from CMOS) for the internal logic block operating with the CMOS levels, an output transistor for executing the charge or discharge of the output load capacitance thereof is formed of a bipolar transistor. Thus, the propagation delay times and their capacitance-dependencies of the output level converter can also be lessened.

19 Claims, 12 Drawing Sheets

//!#%!

BICMOS GATE ARRAY

This application is a continuation of application Ser. No. 102,245, filed on Sept. 28, 1987, which is a continuation of application Ser. No. 008,467, filed Jan. 29, 1987, which is a continuation application of Ser. No. 575,567, filed Jan. 31, 1984, now U.S. Pat. No. 4,689,503.

BACKGROUND OF THE INVENTION

The present invention relates to a technique which is effective when applied to semiconductor integrated circuits, for example, a logic semiconductor integrated circuit whose input and output levels are TTL levels and whose internal logic levels are CMOS levels.

FIG. 1 shows a block diagram of a logic semiconductor integrated circuit IC having TTL levels as its input and output levels and CMOS levels as its internal logic levels, which circuit was studied by the inventors before the present invention.

Such circuit IC includes an input buffer 10 for level-converting input signals of TTL levels $IN_1$, $IN_2$, . . . $IN_n$ into signals of CMOS levels, an internal logic block 11 for executing logic operations with the CMOS levels, and an output buffer 12 for level-converting the CMOS level output signals of the internal logic block 11 into output signals of TTL levels $OUT_1$, $OUT_2$, . . . $OUT_m$. The respective circuits 10, 11 and 12 are fed with a supply voltage $V_{CC}$ of 5 volts, and are properly grounded.

A high level input voltage $V_{iH10}$ to be supplied to the input terminals $IN_1$, $IN_2$, . . . $IN_n$ of the input buffer 10 is set at 2.0 volts or above, while a low level input voltage $V_{iL10}$ is set at 0.8 volt or below. Accordingly, an input threshold voltage $V_{ith10}$ concerning the input terminals $IN_1$, $IN_2$, . . . $IN_n$ of the input buffer 10 is set at 1.3–1.5 volt which is between 0.8 volt and 2.0 volts.

On the other hand, a high level output voltage $V_{oH10}$ to be derived from the output of the input buffer 10 is set to be equal to the high level input voltage $V_{iH11}$ of the internal logic block 11, while a low level output voltage $V_{oL10}$ to be derived from the output of the input buffer 10 is set to be equal to the low level input voltage $V_{iL11}$ of the internal logic block 11. Accordingly, letting $V_{TP}$ and $V_{TN}$ denote the threshold voltages of a P-channel MOS FET and an N-channel MOS FET which constitute a CMOS inverter in the internal logic block 11, respectively, and $V_{CC}$ denote the supply voltage, the above voltages $V_{oH10}$, $V_{iH11}$, $V_{oL10}$ and $V_{iL11}$ are respectively set as follows:

$$V_{oH10} = V_{iH11} > V_{CC} - |V_{TP}| \quad (1)$$
$$V_{oL10} = V_{iL11} < V_{TN} \quad (2)$$

When $V_{CC}$ is set at 5 volts, $|V_{TP}|$ at 0.6 volt and $V_{TN}$ at 0.6 volt, $V_{oH10}$ and $V_{iH11}$ are set at above 4.4 volts, and $V_{oL10}$ and $V_{iL11}$ at below 0.6 volt.

Accordingly, the input logic threshold voltage $V_{ith11}$ of the CMOS inverter in the internal logic block 11 is set at approximately 2.5 volts which is between 0.6 volt and 4.4 volts.

Likewise, the high level output voltage $V_{oH11}$ of the internal logic block 11 and the high level input voltage $V_{iH12}$ of the output buffer 12 are set at above 4.4 volts, the low level output voltage $V_{oL11}$ of the internal logic block 11 and the low level input voltage $V_{iL12}$ of the output buffer 12 are set at below 0.6 volt, and the input logic threshold voltage $V_{ith12}$ of the output buffer 12 is set at approximately 2.5 volts which is between 0.6 volt and 4.4 volts.

In order to generate the output signals of TTL levels, the output buffer 12 has its high level output voltage $V_{oH12}$ set at 2.7 volts or above and its low level output voltage $V_{oL12}$ at 0.5 volt or below.

FIG. 2 is a circuit diagram showing one input buffer 10 which was constructed and studied by the inventors for test purposes before the present invention, and which is constructed of P-channel MOS FETs $M_{p1}$, $M_{p2}$, N-channel MOS FETs $M_{n1}$, $M_{n2}$, $M_{n3}$ and a resistor $R_p$. The gates, sources and drains of the MOS FETs are respectively indicated by symbols g, s and d.

A first stage CMOS inverter composed of the FETs $M_{p1}$ and $M_{n1}$, and a second stage CMOS inverter composed of the FETs $M_{p2}$ and $M_{n2}$ are connected in cascade. The components $R_p$ and $M_{n3}$ constitute a gate protection circuit for protecting the gate insulating films of the FETs $M_{p1}$ and $M_{n1}$. An output capacitance $C_s$ connected to the drains of the FETs $M_{p2}$ and $M_{n2}$ of the second stage CMOS inverter has, in actuality, its value determined by the drain capacitances of the FETs $M_{p2}$ and $M_{n2}$, the wiring stray capacitance between the output of the input buffer 10 and the input of the internal logic block 11, and the input capacitance of the internal logic block 11.

The ratios W/L between the channel widths W and channel lengths L of the MOS FETs $M_{p1}$, $M_{p2}$, $M_{n1}$, $M_{n2}$ and $M_{n3}$ are respectively set at 27/3.5, 42/3, 126/3.5, 42/3 and 15/3. The resistor $R_p$ is set at a resistance of 2 kiloohms.

FIG. 3 illustrates the dependencies of the propagation delay times $t_{pHL}$, $t_{pLH}$ of the input buffer 10 of FIG. 2 upon the output capacitance $C_s$. In the figure, the axis of ordinates represents the propagation delay times, while the axis of abscissas represents the output capacitance $C_s$. FIG. 3 also shows delay time dependencies for the buffers of FIGS. 14, 19, 22 and 31, as will be discussed in detail later.

A definition of the propagation delay times used in FIG. 3 and throughout this specification is shown in FIG. 35. As illustrated in FIG. 35, the first propagation delay time $t_{pHL}$ is defined as a period of time which elapses from the time that an input INPUT to the buffer reaches its 50% value until the time an output OUTPUT from the buffer changing from a high level to a low level reaches its 50% value. The second propagation delay time $t_{pHL}$ is defined as a period of time which elapses from the time the input INPUT to the buffer reaches its 50% value until the time when output OUTPUT from the buffer changing from the low level to the high level reaches its 50% value. In FIG. 35, $t_f$ is defined as a fall time, and $t_r$ as a rise time between the 10% and 90% values of the output of the buffer.

Thus, as understood from FIG. 3, the output capacitance-dependency $K_{HL}$ ($= \Delta t_{pHL}/\Delta C_s$) of the first propagation delay time $t_{pHL}$ of the input buffer 10 in FIG. 2 is about 0.8 nsec/pF, and the output capacitance-dependency $K_{LH}$ ($= \Delta t_{pLH}/\Delta C_s$) of the second propagation delay time $t_{pLH}$ is about 1.4 nsec/pF. Both of these values are relatively large.

In the input buffer 10 of FIG. 2, in order to set the input threshold voltage $V_{ith10}$ at approximately 1.3–1.5 volt, the ratios W/L between the channel widths and channel lengths of the FETs $M_{p1}$ and $M_{n1}$ of the first stage CMOS inverter are made greatly different, and in order to lessen the output capacitance-dependencies $K_{HL}$ and $K_{LH}$ of the respective propagation delay times $t_{pHL}$ and $t_{pLH}$, both the ratios W/L of the FETs $M_{p2}$ and $M_{n2}$ of the second stage CMOS inverter are set at the large value of 42/3 so as to increase the channel conductances of these FETs $M_{p2}$ and $M_{n2}$.

To the end of reducing both the output capacitance-dependencies $K_{HL}$ and $K_{LH}$, the ratios W/L of the FETs $M_{p2}$ and $M_{n2}$ of the second stage CMOS inverter may be increased more and more. This, however, incurs a conspicuous increase in the occupation area of the input buffer 10 on the surface of an integrated circuit chip for the following reason, to form an obstacle to enhancement in the density of integration.

In the production technology of integrated circuits, fining is being vigorously promoted at present. With the present-day photolithography based on exposure to ultraviolet radiation, however, the channel length L of a MOS FET is often set with 3 μm as its practical lower limit value. In order to wet the ratio W/L of the MOS FET at a very large value, therefore, the channel width W thereof must be set at an extraordinary large value. Eventually, the device area of the MOS FET increases conspicuously.

FIG. 4 is a circuit diagram showing one output buffer 12 which was constructed and studied by the inventors for test purposes before the present invention and which is constructed of a P-channel MOS FET $M_{p4}$ and an N-channel MOS FET $M_{n4}$. The gates, sources and drains of the MOS FETs are respectively indicated by symbols g, s and d.

In the integrated circuit IC, the output signal of CMOS level from the internal logic block 11 is applied to the gates of the FETs $M_{p4}$ and $M_{n4}$ of the output buffer 12. Terminal No. 30 is fed with the supply voltage $V_{CC}$ of 5 volts. In order to set the input logic threshold voltage $V_{ith12}$ of the output buffer 12 at approximately 2.5 volts, accordingly, the ratios W/L of the FETs $M_{p4}$ and $M_{n4}$ are set at values equal to each other.

FIG. 4 also shows a TTL circuit 14, which is fed with the supply voltage $V_{CC}$ of 5 volts through terminal No. 35. The output signal of TTL level from the output buffer 12 is derived from terminal No. 20, and is supplied to one emitter of the multi-emitter transistor $Q_1$ of the TTL circuit 14 through terminal No. 32.

A variety of TTL circuits are presently known from publications in the art including a standard TTL circuit, a Schottky TTL circuit, a low power Schottky TTL circuit and an advanced low power Schottky TTL circuit. Naturally, the characteristics of these circuits are somewhat different from one another.

The output of the output buffer 12 needs to drive a large number of inputs of the TTL circuit 14 at the same time and in parallel. A criterion for the drive ability is to be capable of driving 20 inputs of a low power Schottky TTL circuit in parallel.

When the output of the output buffer 12 is at its low level, a low level input current $I_{IL}$ of 0.4 mA flows from one input of the low power Schottky TTL circuit into the drain-source path of the N-channel MOS FET $M_{n4}$ of the output buffer 12. Accordingly, the FET $M_{n4}$ needs to pour a total of 8 mA in order that the output buffer 12 may drive the aforementioned 20 inputs to the low level.

On the other hand, the low level output voltage $V_{oL12}$ of the output buffer 12 must be 0.5 volt or below as already explained. Therefore, the ON-resistance $R_{ON}$ of the N-channel MOS FET $M_{n4}$ of the output buffer 12 must be set at a small value of 0.5 volt/8 milliampere = 62.5 ohms or so.

In order to make the ON-resistance $R_{ON}$ of the FET $M_{n4}$ such a low resistance, the ratio W/L of the FET $M_{n4}$ must be set at a very large value of 700/3 to 1000/3. Meanwhile, as stated above, both the ratios W/L of the FETs $M_{p4}$ and $M_{n4}$ need to be equal values for the purpose of setting the input logic threshold voltage $V_{ith12}$ of the output buffer 12 at approximately 2.5 volts. Therefore, also the ratio W/L of the P-channel MOS FET $M_{p4}$ of the output buffer 12 must be set at the very large value of 700/3 to 1000/3.

This fact similarly brings about a conspicuous increase in the occupation area of the output buffer 12 on the surface of the integrated circuit chip, to hamper enhancement in the density of integration. Moreover, it incurs drastic lowering in the switching speed of the internal logic block 11 for the following reason.

When both the ratios W/L of the two MOS FETs $M_{p4}$ and $M_{n4}$ of the output buffer 12 are set at the large values noted above, the gate capacitances of these MOS FETs become large values proportionally. Since the gate capacitances of the FETs $M_{p4}$ and $M_{n4}$ constitute the output load capacitance of the internal logic block 11, these gate capacitances and the output resistance of the internal logic block 11 incur the lowering of the switching speed of the internal logic block 11.

Meanwhile, since the output of the output buffer 12 is not only derived from the external output terminal (terminal No. 20) of the integrated circuit IC, but also connected to the large number of input terminals of the TTL circuit 14 through external wiring, the output load capacitance $C_x$ of the output buffer 12 often becomes a very large value.

FIG. 5 illustrates the dependencies of the propagation delay times $t_{pHL}$, $t_{pLH}$ upon the output load capacitance $cC_x$ of the output buffer 12 in FIG. 4. In the graph of FIG. 5, the axis of ordinates represents the propagation delay times, while the axis of abscissas represents the output load capacitance. FIG. 5 also shows such delay time dependencies of FIG. 34, as will be discussed later.

Thus, as understood from FIG. 5, the capacitance-dependency $K_{HL} (=\Delta t_{pHL}/\Delta C_x)$ of the first propagation delay time $t_{pHL}$ of the output buffer 12 in FIG. 4 is about 0.3 nsec/pF, and the capacitance-dependency $K_{LH} (=\Delta t_{pLH}/\Delta C_x)$ of the second propagation delay time $t_{pLH}$ is about 0.17 nsec/pF. Both of these are undesirably large.

Accordingly, the input buffer 10 of FIG. 2 which the inventors tested in development of the present invention involves problems as summed up below.

(1) In order to lessen the output capacitance-dependencies of the propagation delay times of the input buffer 10, the ratios W/L of both the MOS FETs $M_{p2}$ and $M_{n2}$ of the second stage CMOS inverter of the input buffer 10 must be made large, which hampers enhancement in the density of integration. Particularly in a case where the integrated circuit IC is of the master slice type or the semi-custom gate array type, there is the possibility that a very large number of gate input terminals in the internal logic block 11 will be connected to the output of the input buffer 10. When the output capacitance $C_s$ of the input buffer 10 accordingly becomes very great, the above problem is very serious.

(2) Further, the first stage of the input buffer 10 is formed of the CMOS inverter $M_{p1}$, $M_{n1}$. Therefore, even when the gate protection circuit composed of the elements $R_p$ and $M_{n3}$ is connected, the breakdown strengths of the gate insulating films of both the MOS FETs $M_{p1}$, $M_{n1}$ against a surge voltage applied to the input terminal $IN_1$ are not satisfactory.

In addition, the output buffer 12 of FIG. 4 which the inventors tested in the development of the present invention involves problems as summed up below.

(3) In order to set the input logic threshold voltage $V_{ith12}$ of the output buffer 12 at approximately 2.5 volts and to enhance the current sink ability at the low level output of the output buffer 12, the ratios W/L of both the MOS FETs $M_{p4}$ and $M_{n4}$ must be set at large values equal to each other, which hampers enhancement in the density of integration.

(4) When the ratios W/L of both the MOS FETs $M_{p4}$ and $M_{n4}$ of the output buffer 12 are made large, the gate capacitances of these MOS FETs also increase. In consequence, these gate capacitances and the output resistance of the internal logic block 11 incur lowering in the switching speed of the internal logic block 11. Particularly in a case where the output stage of the internal logic block 11 is composed of MOS FETs of high output resistance, the lowering of the switching speed is conspicuously problematic.

(5) Since the output buffer 12 is composed of the MOS FETs $M_{p4}$ and $M_{n4}$, the dependencies of the propagation delay times upon the output load capacitance $C_x$ are great. Particularly in a case where a large number of input terminals of the TTL circuit 14 are connected to the output of the output buffer 12, this problem becomes important.

SUMMARY OF THE INVENTION

The present invention concerns a semiconductor integrated circuit having an internal logic block for generating output signals of CMOS levels in response to input signals of CMOS levels applied thereto, an input buffer for level conversion such as TTL—CMOS level conversion for the internal logic block, and/or an output buffer for level conversion such as CMOS—TTL level conversion. In particular, the present invention has for its objects to permit enhancement in the density of integration and to lessen the output capacitance-dependency of the operating speed of the input buffer and/or the output buffer and enhance such operating speed.

The aforementioned and other objects of the present invention and novel features thereof will become apparent from the description of the specification as well as the accompanying drawings of the present invention.

Typical aspects of performance of the present invention will be briefly explained below.

In the level converter of a TTL—CMOS level conversion input buffer for an internal logic block which operates with CMOS levels, output transistors for executing the charge or discharge of the output capacitance of the level converter are formed of bipolar transistors, whereby the object of reducing the propagation delay time of the input buffer and the capacitance-dependency thereof can be accomplished owing to the function that, even when smaller in device size than a MOS FET, the bipolar transistor exhibits a lower output resistance and a higher current gain, so it can produce a great charging current or discharging current.

Further, in the level converter of a CMOS—TTL conversion output buffer for an internal logic block which operates with CMOS levels, output transistors for executing the charge or discharge of the output load capacitance of the level converter are formed of bipolar transistors, whereby the object of reducing the propagation delay time of the output buffer and the capacitance-dependency thereof can be accomplished owing to the function that, even when smaller in device size than a MOS FET, the bipolar transistor exhibits a lower output resistance and a higher current gain, so it can produce a great charging current or discharging current.

DESCRIPTION OF THE PREFERRED EMBODIMENTS

Figure 1:
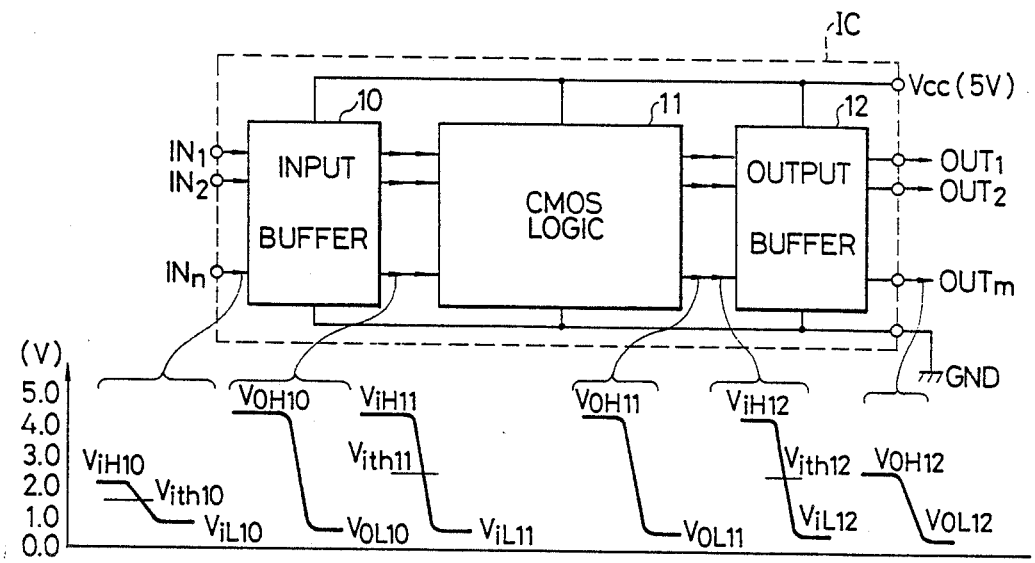
FIG. 1 shows a block diagram of a logic semiconductor integrated circuit IC which was studied by the inventors before the present invention.

Now, embodiments of the present invention will be described referring to the drawings.

Figure 6:
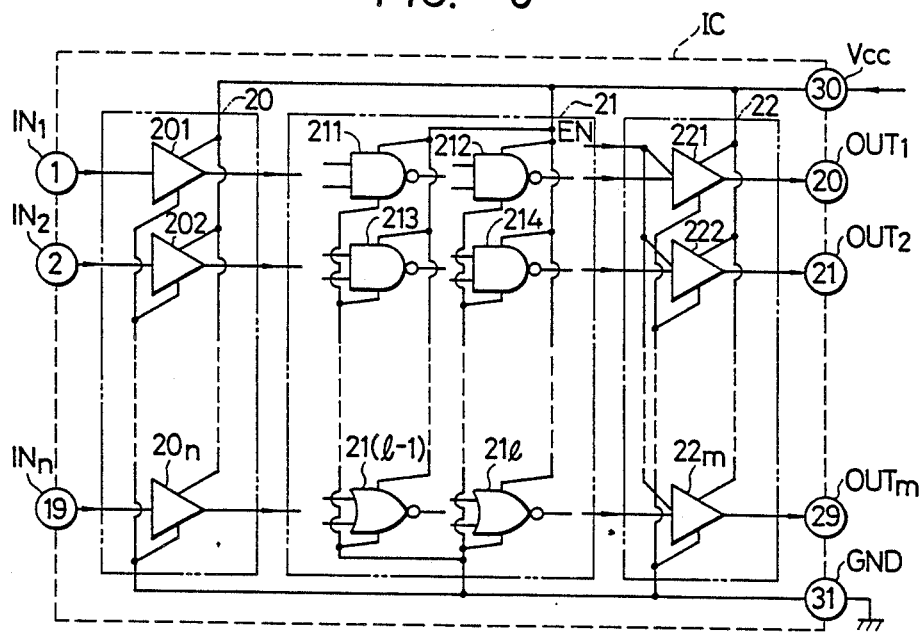
FIG. 6 shows a block diagram of a logic semiconductor integrated circuit according to an embodiment of the present invention.

FIG. 6 shows a block diagram of a logic semiconductor integrated circuit IC according to an embodiment of the present invention. The integrated circuit includes a TTL—CMOS level conversion input buffer 20 which executes an operation similar to that of the input buffer 10 in FIG 1, an internal logic block 21 which operates with CMOS levels similarly to the internal logic block 11 in FIG. 1, and a CMOS—TTL level conversion output buffer 22 which executes an operation similar to that of the output buffer 12 in FIG. 1. The respective circuits 20, 21 and 22 are fed with a supply voltage $V_{CC}$ of 5 volts through terminal No. 30, and are properly grounded through terminal No. 31. The respective input and output high and low levels for the input buffer 20, the internal logic block 21 and the output buffer 22 are substantially the same as those respectively shown for the input buffer 10, the logic block 11 and the output buffer 12 in FIG. 1.

The input buffer 20 has a plurality of TTL—CMOS level converters 201, 202, ... 20n, the respective inputs of which are connected to terminal No. 1, terminal No. 2, ... terminal No. 19 and the respective outputs of which are connected with the internal logic block 21 by aluminum wiring layers inside the circuit IC.

The internal logic block 21 includes CMOS·NAND gates 211, 212, 213, 214, CMOS·NOR gates 21(λ−1), 21λ, and if necessary, CMOS exclusive OR gates, CMOS transmission gates, CMOS inverters etc.

Figure 7:
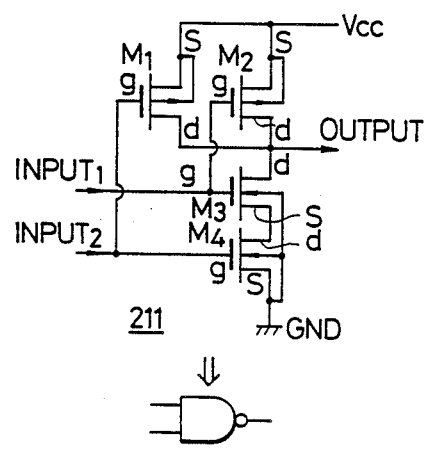
FIGS. 7 and 8 show circuit examples of a CMOS-NAND gate 21λ in the circuit of FIG. 6.
Figure 8:
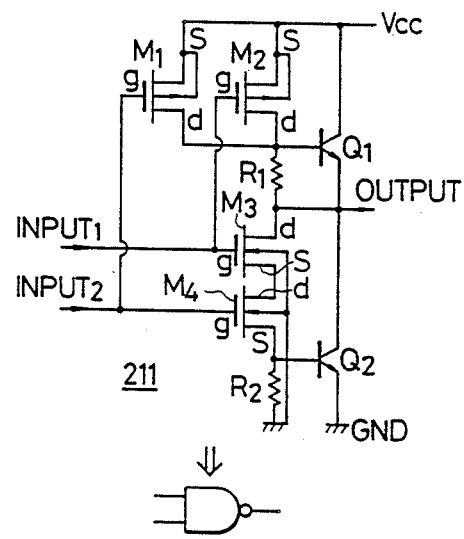

As shown in FIG. 7 by way of example, the CMOS·NAND gate 211 is constructed of a pure CMOS circuit which includes P-channel MOS FETs $M_1$, $M_2$ and N-channel MOS FETs $M_3$, $M_4$. Another example of the CMOS·NAND gate 211 can be constructed of a quasi-CMOS circuit which further includes N-P-N transistors $Q_1$, $Q_2$ and resistors $R_1$, $R_2$ as shown in FIG. 8. Since this quasi-CMOS circuit has its output stage composed of the bipolar transistors $Q_1$, $Q_2$, the output drive ability is enhanced, and the output load capacitance-dependency of the propagation delay time can be lessened.

Figure 9:
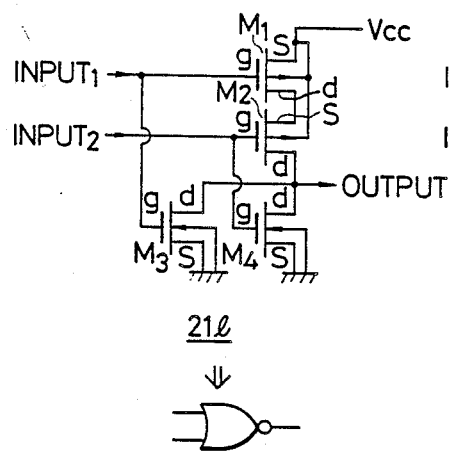
FIGS. 9 and 10 show circuit examples of CMOS-NOR gate 21λ in the circuit of FIG. 6.
Figure 10:
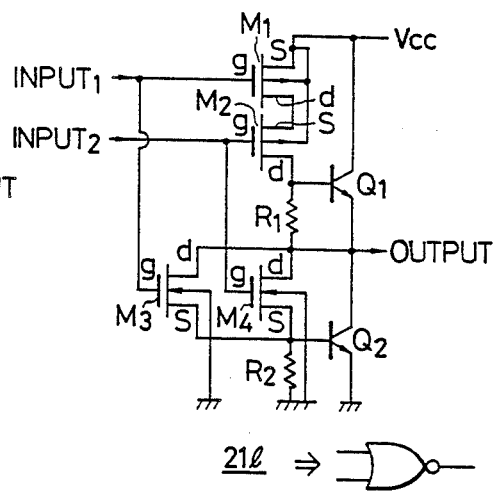

As shown in FIG. 9 by way of example, the CMOS·NOR gate 21λ is constructed of a pure CMOS circuit which includes P-channel MOS FETs $M_1$, $M_2$ and N-channel MOS FETs $M_3$, $M_4$. Another example of the CMOS·NOR gate 21λ can be constructed of a quasi-CMOS circuit which further includes N-P-N transistors $Q_1$, $Q_2$ and resistors $R_1$, $R_2$ as shown in FIG. 10. Since this quasi-CMOS circuit has its output stage composed of the bipolar transistors $Q_1$, $Q_2$, the output drive ability is enhanced, and the output load capacitance-dependency of the propagation delay time can be lessened.

In the internal logic block 21, these CMOS·NAND gates and CMOS·NOR gates are connected in various forms in accordance with the master slice type or the semi-custom gate array type.

Figure 11:
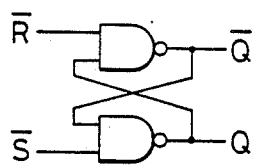
FIGS. 11 and 12 show circuit examples of CMOS-R-S flip-flops within an internal logic block 21 in the circuit of FIG. 6.
Figure 12:
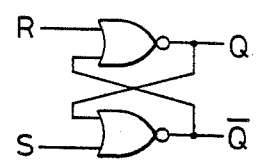
Figure 13:
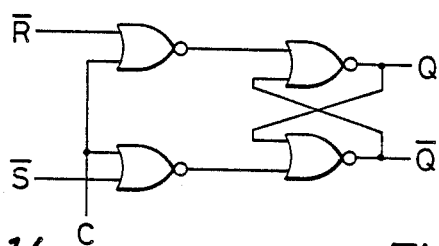
FIG. 13 shows a circuit example of a CMOS gated R-S flip-flop within the internal logic block 21 in the circuit of FIG. 6.

For example, an R-S flip-flop is constructed by combining two of the CMOS·NAND gates as shown in FIG. 11 or by combining two of the CMOS·NOR gates as shown in FIG. 12. Further, a gated R-S flip-flop which is controlled by a clock signal C is constructed by combining four of the CMOS·NOR gates as shown in FIG. 13.

In this manner, in the logic semiconductor integrated circuit IC of the master slice type or the gate array type conforming to the needs of the users, the outputs of the level converters 201, 202, ... 20n of the input buffer 20 and the inputs of the various gates or inverters of the internal logic block 21 are connected in various forms by altering only the wiring pattern thereof. Similarly, the outputs of the various gates or inverters of the internal logic block 21 and the inputs of the level converters 221, 222, ... 22m of the output buffer 22 are connected in various forms.

The output buffer 22 has the plurality of CMOS—TTL level converters 221, 222, ... 22m, the respective outputs of which are connected to terminal No. 20, terminal No. 21, ... terminal No. 29.

The essential features of the level converters 201, 202, ... 20n of the input buffer 20 are as stated below.

(1) The input threshold voltage $V_{ith}$ of each of the level converters 201, 202, ... 20n is set between a TTL low level input voltage of 0.8 volt and a TTL high level input voltage of 2.0 volts.

(2) An output transistor, which executes the charge or discharge of the output capacitance $C_s$ of each of the level converters 201, 202, ... 20n in response to an input signal supplied to the input terminal thereof, is formed of a bipolar transistor.

Further, meritorious features in preferable aspects of performance of the level converters 201, 202, ... 20n of the input buffer 20 are as stated below (noting that the transistors referred to below are in conjunction with FIGS. 14 to 31 discussed in detail hereinafter.)

(3) A Schottky barrier diode is connected between the base and collector of the bipolar output transistor $Q_1$ which executes the discharge of the output capacitance $C_s$ in the above item (2).

(4) A second Schottky barrier diode is connected between the base and collector of a driver transistor $Q_2$ which serves to drive the base of the bipolar output transistor $Q_1$ with its output in response to the input signal supplied to the input terminal of each of the level converters 201, 202, ... 20n.

(5) The output transistor which executes the charge of the output capacitance $C_s$ of each level converters 201, 202, ... 20n is also formed of a bipolar transistor $Q_3$.

(6) The base signal or collector signal of the driver transistor $Q_2$ is transmitted to the base of the charging bipolar output transistor $Q_3$ through a MOS buffer which has a high input impedance and an amplifying function.

(7) A Schottky barrier diode $D_1$ for level shift is connected between the input terminal of each of the level converters 201, 202, ... 20n and the base of the driver transistor $Q_2$.

(8) A P-N-P emitter follower transistor $Q_4$ and a P-N junction diode for level shift $D_2$ are connected between the input terminal of each of the level converters 201, 202, ... 20n and the base of the driver transistor $Q_2$.

FIGS. 14 to 31 show diagrams of various circuits of the level converter 201 of the input buffer 20 according to embodiments of the present invention. All these level converters have the essential features of the above items (1) and (2). Further, these level converters have at least one of the meritorious features of the above items (3) to (8).

Figure 14:
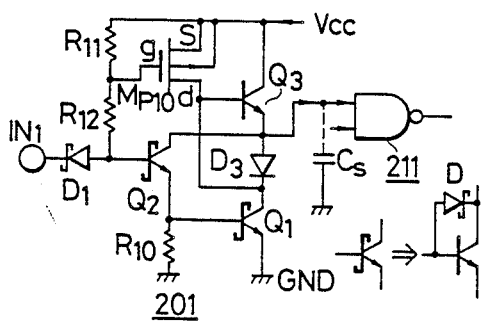
FIGS. 14 to 31 show diagrams of various circuits of the level converter 201 of an input buffer 20 according to embodiments of the present invention.

In the level converter 201 of FIG. 14, the input terminal $IN_1$ is connected to the cathode of the Schottky barrier diode for level shift $D_1$, the anode of which is connected to the base of the driver transistor $Q_2$. The kind of the barrier metal of this diode $D_1$ and the barrier area thereof are determined so as to set the forward voltage $V_F$ thereof at 0.35 volt to 0.41 volt. The forward voltages $V_F$ of the Schottky barrier diodes $D_1$ of the level converters in FIGS. 15 to 31 are similarly set at 0.35 volt to 0.41 volt.

Further, in the arrangement of FIG. 14, each of the driver transistor $Q_2$ and the discharging output transistor $Q_1$ has a Schottky barrier diode D connected between the base and collector thereof as indicated by the hook-shaped base electrode symbol thereof. As is well known, the clamped transistor provided with the Schottky barrier diode in this manner has a very short storage time. In the ensuing embodiments, transistors having hook-shaped base electrode symbols are such clamped transistors. The base of the discharging output transistor $Q_1$ is connected to a ground potential point through a resistor of 5 kiloohms $R_{10}$ for discharging the base charges thereof.

Besides, in the arrangement of FIG. 14, a resistor of 18 kiloohms $R_{11}$ and a resistor of 2 kiloohms $R_{12}$ are connected in series between the supply voltage $V_{CC}$ and the anode of the Schottky barrier diode $D_1$. The node of both the resistors $R_{11}$ and $R_{12}$ is connected to the gate of a P-channel MOS FET $M_{p10}$ which serves as a phase inverter, and the drain of which is connected to the base of the charging output transistor $Q_3$.

Further, a diode $D_3$ is connected in order to reliably turn "off" the transistor $Q_3$ when the level converter 201 produces its low level output. The output of the level converter 201 at the emitter of the charging output transistor $Q_3$ is connected to the output capacitance $C_s$, and is also connected to one input of the CMOS·NAND gate 211 of the internal logic block 21.

The emitter area of each of the bipolar transistors $Q_1$, $Q_2$ and $Q_3$ is set at 100 $\mu m^2$ to 144 $\mu m^2$, and can also be set at a still smaller area. Further, the ratio W/L of each MOS FET is set at a value of 32/3 to 64/3.

It has been confirmed by the inventors that the embodiment of FIG. 14 having the above arrangement exhibits propagation delay times and the output capacitance-dependencies thereof listed below:

| | |
|---|---|
| $t_{pHL}$ (for $C_s = 0$ pF) | 1.6 nsec |
| $t_{pLH}$ (for $C_s = 0$ pF) | 5.7 nsec |
| $K_{HL}$ | 0.4 nsec/pF |
| $K_{LH}$ | 0.4 nsec/pF |

Figure 2:
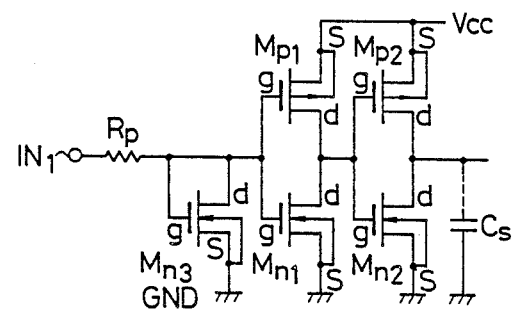
FIG. 2 shows a circuit diagram of an input buffer which was studied by the inventors before the present invention.

It can be appreciated that the aforementioned propagation delay times $t_{pHL}$, $t_{pLH}$ and output capacitance-dependencies $K_{HL}$, $K_{LH}$ are excellent as compared with the characteristics of the input buffer 10 in FIG. 2.

Moreover, the level converter 201 in FIG. 14 can attain desired characteristics for reasons stated below.

(1) The forward voltage $V_F$ of the Schottky barrier diode $D_1$ is set at 0.35 to 0.41 volt, and the base-emitter voltages $V_{BE1}$, $V_{BE2}$ of the transistors $Q_1$, $Q_2$ are approximately 0.75 volt. Therefore, the input threshold voltage $V_{ith}$ of the level converter 201 is set as follows:

$$V_{ith} = -V_F + V_{BE1} + V_{BE2}$$
$$= 1.09 \text{ to } 1.15 \text{ volt}$$

(2) The output transistors $Q_1$, $Q_3$ for executing the charge or discharge of the output capacitance $C_s$ of the level converter 201 are formed of the bipolar transistors of low output resistances. Therefore, the switching operation speeds can be raised or the propagation delay times can be shortened, and the output capacitance-dependencies of the propagation delay times can be lessened.

(3) The Schottky barrier diode is connected between the base and collector of each of the transistors $Q_1$, $Q_2$ which are driven into their saturation regions. Therefore, when both the transistors $Q_1$, $Q_2$ operate to switch from "on" into "off", the storage times can be shortened. (4) When the potential of the node of the resistors $R_{11}$ and $R_{12}$ rises to turn "off" the phase inverting MOS FET $M_{p10}$ and the charging output transistor $Q_3$, current to flow from the node into the gate of the MOS FET $M_{p10}$ becomes very small because the input impedance of the gate of the MOS FET $M_{p10}$ is very high. Accordingly, the embodiment enhances an operating speed for switching the charging output transistor $Q_3$ from "off" into "on" when compared with a case of forming the phase inverter by the use of a bipolar transistor, not the MOS FET $M_{p10}$.

Figure 15:
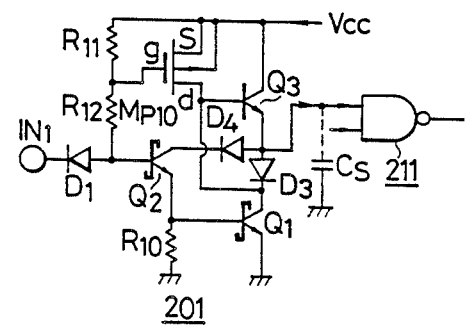

The level converter 201 of FIG. 15 differs from that of FIG. 14 only in that another P-N junction diode $D_4$ is added. Such addition of the diode $D_4$ makes it possible to lower the low level output voltage of the level converter still more.

Regarding the level converter 201 of FIG. 15, the propagation delay times and the output capacitance-dependencies thereof have been confirmed as follows by the inventors:

| | |
|---|---|
| $t_{pHL}$ (for $C_s = 0$ pF) | 1.89 nsec |
| $t_{pLH}$ (for $C_s = 0$ pF) | 6.37 nsec |
| $K_{HL}$ | 0.4 nsec/pF |
| $K_{LH}$ | 0.4 nsec/pF |

Further, also the level converter 201 of FIG. 15 can attain desired characteristics for the same reasons as in the case of FIG. 14.

Figure 16:
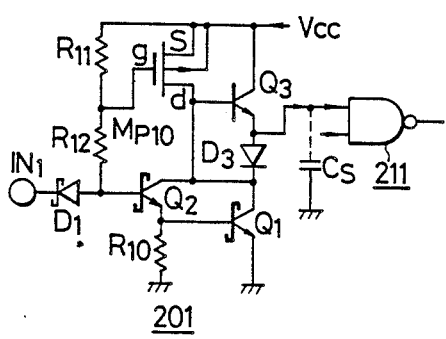

The level converter 201 of FIG. 16 differs from that of FIG. 14 only in the collector connection of the driver transistor $Q_2$. The propagation delay times and their output capacitance-dependencies of such level converter in FIG. 17 have been confirmed as follows:

| | |
|---|---|
| $t_{pHL}$ (for $C_s = 0$ pF) | 1.81 nsec |
| $t_{pLH}$ (for $C_s = 0$ pF) | 5.08 nsec |
| $K_{HL}$ | 0.4 nsec/pF |
| $K_{LH}$ | 0.4 nsec/pF |

Also the level converter 201 of FIG. 16 can attain desired characteristics for the same reasons as in the case of FIG. 14.

Figure 17:
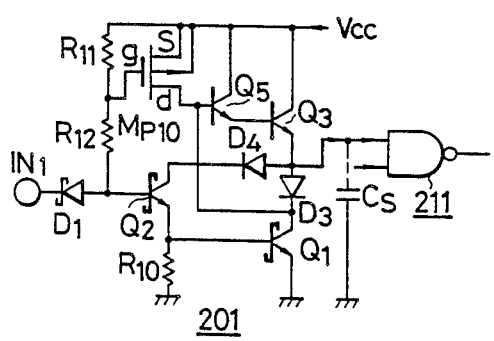

The level converter 201 of FIG. 17 differs from that of FIG. 15 only in that another N-P-N transistor $Q_5$ is connected between the drain of the phase inverting MOS FET $M_{p10}$ and the base of the charging output transistor $Q_3$. The propagation delay times and their output capacitance-dependencies of such level converter on FIG. 17 have been confirmed as follows:

| | |
|---|---|
| $t_{pHL}$ (for $C_s = 0$ pF) | 2.01 nsec |
| $t_{pLH}$ (for $C_s = 0$ pF) | 7.30 nsec |
| $K_{HL}$ | 0.4 nsec/pF |
| $K_{LH}$ | 0.4 nsec/pF |

Figure 18:
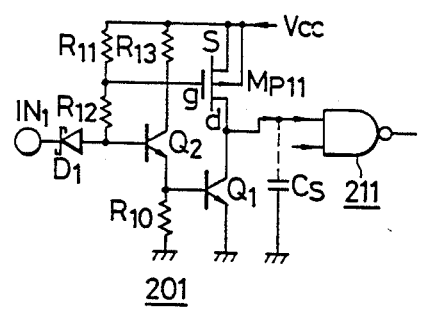

In the level converter 201 of FIG. 18, the transistors $Q_1$, $Q_2$ are clamped transistors with Schottky barrier diodes, and the base of the discharging output transistor $Q_1$ is connected to the ground potential point through the resistor of 5 kiloohms $R_{10}$ for discharging base charges. In addition, a resistor of 20 kiloohms $R_{13}$ for limiting a collector current is connected to the collector of the transistor $Q_2$.

The resistor of 18 kiloohms $R_{11}$ and the resistor of 2 kiloohms $R_{12}$ are connected in series between the supply voltage $V_{CC}$ and the anode of the Schottky barrier diode $D_1$. The node of both the resistors $R_{11}$ and $R_{12}$ is connected to the gate of a P-channel MOS FET $M_{p11}$ serving as a charging output transistor. In addition, the ratio W/L of this FET $M_{p11}$ is 64/3.

The propagation delay times and their output capacitance-dependencies of such level converter 201 in FIG. 18 have been confirmed as follows:

| | |
|---|---|
| $t_{pHL}$ (for $C_s = 0$ pF) | 1.9 nsec |
| $t_{pLH}$ (for $C_s = 0$ pF) | 2.9 nsec |
| $K_{HL}$ | 0.4 nsec/pF |
| $K_{LH}$ | 1.3 nsec/pF |

Further, the level converter 201 in FIG. 18 can attain desired characteristics for reasons stated below. (1) Likewise to the case of FIG. 14, the input threshold voltage $V_{ith}$ of the level converter 201 can be set at 1.09 to 1.15 volt.

(2) The output transistor $Q_1$ for executing the discharge of the output capacitance $C_s$ of the level converter 201 is formed of the bipolar transistor of low output resistance. Therefore, the speed of a switching operation at the discharge of the output capacitance can be enhanced or the propagation delay times can be shortened, and the output capacitance-dependencies of the propagation delay times can be lessened.

(3) Likewise to the case of FIG. 14, the storage times of the transistors $Q_1$, $Q_2$ can be shortened.

Figure 19:
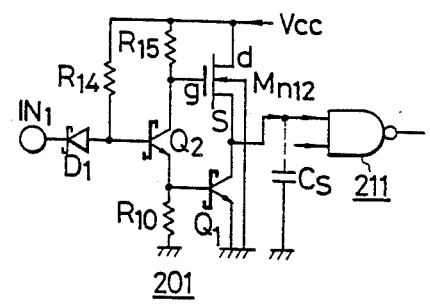

In the level converter 201 of FIG. 19, the transistors $Q_1$, $Q_2$ are the clamped transistors with the Schottky barrier diodes, and the base of the discharging output transistor $Q_1$ is connected to the ground potential point through the resistor of 5 kiloohms $R_{10}$ for discharging base charges. A load resistor of 8 kiloohms $R_{15}$ is connected to the collector of the transistor $Q_2$, and a resistor of 20 kiloohms $R_{14}$ is incorporated between the supply voltage $V_{CC}$ and the anode of the Schottky barrier diode $D_1$. The collector signal of the driver transistor $Q_2$ is applied to the gate of an N-channel MOS FET $M_{n12}$ which serves as a charging output transistor. In addition, the ratio W/L of this FET $M_{n12}$ is set at 64/3.

The propagation delay times and their output capacitance-dependencies of such level converter 201 in FIG. 19 have been confirmed as follows:

| | |
|---|---|
| $t_{pHL}$ (for $C_s = 0$ pF) | 1.1 nsec |
| $t_{pLH}$ (for $C_s = 0$ pF) | 8.6 nsec |
| $K_{HL}$ | 0.3 nsec/pF |
| $K_{LH}$ | 2.0 nsec/pF |

Further, the level converter 201 of FIG. 19 can attain desired characteristics for reasons similar to those in the case of FIG. 18.

Figure 20:
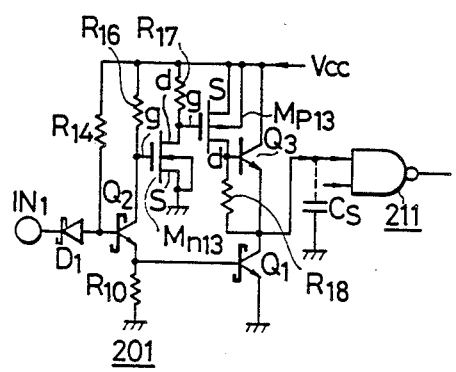

In the level converter 201 of FIG. 20, the transistors $Q_1$, $Q_2$ are similarly the clamped transistors, and the base of the discharging output transistor $Q_1$ is connected to the ground potential point through the resistor of 5 kiloohms $R_{10}$ for discharging base charges. A load resistor of 10 kiloohms $R_{16}$ is connected to the collector of the transistor $Q_2$, and the resistor of 20 kiloohms $R_{14}$ is connected between the supply voltage $V_{CC}$ and the anode of the Schottky barrier diode $D_1$. The collector signal of the driver transistor $Q_2$ is applied to the gate of an N-channel MOS FET $M_{n13}$ serving as an amplifier transistor. The ratio W/L of the FET $M_{n13}$ is set at 32/3, and a load resistor of 20 kiloohms $R_{17}$ is connected to the drain of the FET $M_{n13}$. The drain signal of the FET $M_{n13}$ is applied to the gate of a P-channel MOS FET $M_{p13}$ serving as an amplifier transistor. The ratio W/L of the FET $M_{p13}$ is set at 64/3, and a resistor of 10 kiloohms $R_{18}$ which serves as a load resistor and also as a resistor for discharging the base charges of the charging bipolar output transistor $Q_3$ is connected to the drain of the FET $M_{p13}$.

The propagation delay times and their output capacitance-dependencies of such level converter 201 in FIG. 20 have been confirmed as follows:

| | |
|---|---|
| $t_{pHL}$ (for $C_s = 0$ pF) | 2.2 nsec |
| $t_{pLH}$ (for $C_s = 0$ pF) | 7.5 nsec |
| $K_{HL}$ | 0.4 nsec/pF |
| $K_{LH}$ | 0.4 nsec/pF |

Further, the level converter 201 in FIG. 20 can attain desired characteristics for reasons stated below.

(1) Likewise to the case of FIG. 14, the input threshold voltage $V_{ith}$ of the level converter 201 can be set at 1.09 to 1.15 volt.

(2) Likewise to the case of FIG. 14, the speed of a switching operation for the charge or discharge of the output capacitance $C_s$ can be enhanced or the propagation delay times can be shortened, and the output capacitance-dependencies of the propagation delay times can be lessened.

(3) Likewise to the case of FIG. 14, the storage times of the transistors $Q_2$, $Q_2$ can be shortened.

(4) When the collector potential of the driver transistor $Q_2$ rises to operate the charging output transistor $Q_3$ so as to switch from "off" into "on", the amplifier MOS FETs $M_{n13}$ and $M_{p13}$ amplify the change of the collector potential of the transistor $Q_2$ and transmit the amplified signal to the base of the transistor $Q_3$. Moreover, since the gate input impedance of the MOS FET $M_{n13}$ is very high, a large base current is inhibited from directly flowing from the collector of the transistor $Q_2$ into the base of the transistor $Q_3$. Therefore, the switching speed of the output transistor $Q_3$ can be enhanced.

Figure 21:
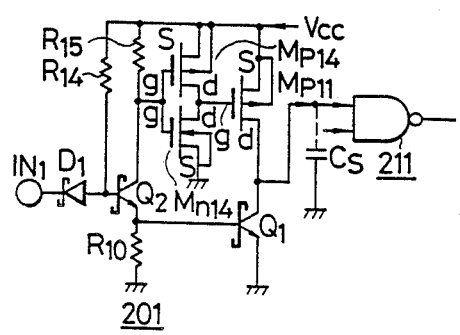

In the level converter 201 of FIG. 21, $Q_1$ and $Q_2$ indicate the clamped transistors, and $D_1$ indicates the Schottky barrier diode for level shift. The resistors $R_{10}$, $R_{14}$ and $R_{15}$ are respectively set at 5 kiloohms, 20 kiloohms and 8 kiloohms. The collector signal of the driver transistor $Q_2$ is applied to both the gates of a P-channel MOS FET $M_{p14}$ and an N-channel MOS FET $M_{n14}$ which constitute a CMOS inverter serving as a voltage amplifier. The drain signal of both the MOS FETs $M_{p14}$, $M_{n14}$ is applied to the gate of the P-channel MOS FET $M_{p11}$ which serves as the charging output transistor. The ratios W/L of the FETs $M_{p14}$, $M_{n14}$ and $M_{p11}$ are respectively set at 24/3, 22/3 and 64/3.

The propagation delay times and their output capacitance-dependencies of such level converter 201 in FIG. 21 have been confirmed as follows:

| | |
|---|---|
| $t_{pHL}$ (for $C_s = 0$ pF) | 2.02 nsec |
| $t_{pLH}$ (for $C_s = 0$ pF) | 4.27 nsec |
| $K_{HL}$ | 0.42 nsec/pF |

-continued

| | |
|---|---|
| K$_{LH}$ | 1.32 nsec/pF |

Further, the level converter 201 in FIG. 21 can attain desired characteristics for the following reasons:

(1) Likewise to the case of FIG. 14, the input threshold voltage V$_{ith}$ of the level converter 201 can be set at 1.09 to 1.15 volt.

(2) The output transistor Q$_1$ for executing the discharge of the output capacitance C$_s$ of the level converter 201 is formed of the bipolar transistor of low output resistance. Therefore, the speed of a switching operation at the discharge of the output capacitance can be enhanced, or the propagation delay times can be shortened, and the output capacitance-dependencies of the propagation delay times can be lessened.

(3) Likewise to the case of FIG. 14, the storage times of the transistors Q$_1$, Q$_2$ can be shortened.

Figure 22:
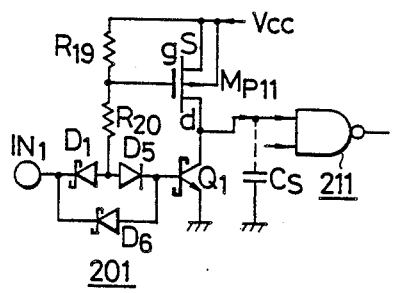

In the level converter 201 of FIG. 22, Q$_1$ indicates the clamped transistor as the discharging output transistor, and the cathode of the level-shifting Schottky barrier diode D$_1$ is connected to the input terminal IN$_1$. A P-N junction diode D$_5$ for level shift is connected between the anode of the diode D$_1$ and the base of the transistor Q$_1$, resistors R$_{19}$ and R$_{20}$ which are set at equal resistance values of 10 kiloohms are connected in a series between the supply voltage V$_{CC}$ and both the anodes of the diodes D$_1$ and D$_5$, and a Schottky barrier diode D$_6$ for discharging base charges is connected between the input terminal IN$_1$ and the base of the transistor Q$_1$.

The node of the resistors R$_{19}$ and R$_{20}$ is connected to the gate of the P-channel MOS FET M$_{p11}$ serving as the charging output transistor, and the ratio W/L of the FET M$_{p11}$ is set at 64/3.

The propagation delay times and their output capacitance-dependencies of such level converter in FIG. 22 have been confirmed as follows:

| | |
|---|---|
| t$_{pHL}$ (for C$_s$ = 0 pF) | 2.44 nsec |
| t$_{pLH}$ (for C$_s$ = 0 pF) | 5.41 nsec |
| K$_{HL}$ | 0.1 nsec/pF |
| K$_{LH}$ | 5.3 nsec/pF |

Further, the level converter 201 in FIG. 22 can attain desired characteristics for the following reasons:

(1) The forward voltage V$_{F1}$ of the Schottky barrier diode D$_1$ is set at 0.35 to 0.41 volt, the forward voltage V$_{F5}$ of the P-N junction diode D$_5$ is set at 0.75 volt, and the base-emitter voltage V$_{BE1}$ of the transistor Q$_1$ is 0.75 volt. Therefore, the input threshold voltage V$_{ith}$ of the level converter 201 for turning "on" the transistor Q$_1$ is set as below:

$$V_{ith} = -V_{F1} + V_{F5} + V_{BE1}$$
$$= 1.09 \text{ to } 1.15 \text{ volt}$$

(2) The output transistor Q$_1$ for executing the discharge of the output capacitance C$_s$ is formed of the bipolar transistor of low output resistance. Therefore, the switching times or the propagation delay times can be shortened, and the output capacitance-dependencies of the propagation delay times can be lessened.

(3) Since the transistor Q$_1$ is the clamped transistor, its storage time can be shortened.

Figure 23:
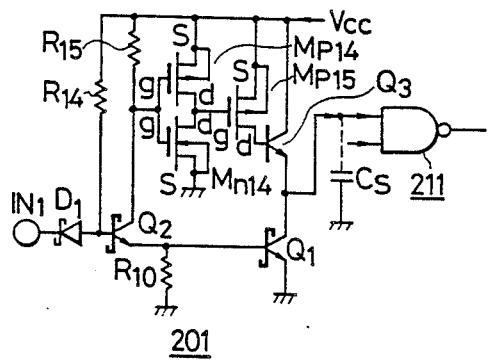

In the level converter 201 of FIG. 23, Q$_1$ and Q$_2$ indicate the clamped transistors, and D$_1$ indicates the Schottky barrier diode for level shift. The resistors R$_{10}$, R$_{14}$ and R$_{15}$ are respectively set at 5 kiloohms, 20 kiloohms and 8 kiloohms. The collector signal of the driver transistor Q$_2$ is applied to both the gates of the P-channel MOS FET M$_{p14}$ and N-channel MOS FET M$_{n14}$ which constitute the CMOS inverter serving as the voltage amplifier, and the drain output of both the MOS FETs is applied to the gate of a switching P-channel MOS FET M$_{p15}$. The ratios W/L of the FETs M$_{p14}$, M$_{n14}$ and M$_{p15}$ are respectively set at 24/3, 32/3 and 64/3.

The drain output of the MOS FET M$_{p15}$ is applied to the base of the bipolar transistor Q$_3$ which serves as the charging output transistor.

The propagation delay times and their output capacitance-dependencies of such level converter in FIG. 23 have been confirmed as follows:

| | |
|---|---|
| t$_{pHL}$ (for C$_s$ = 0 pF) | 5.07 nsec |
| t$_{pLH}$ (for C$_s$ = 0 pF) | 5.09 nsec |
| K$_{HL}$ | 0.4 nsec/pF |
| K$_{LH}$ | 0.4 nsec/pF |

Further, the level converter 201 in FIG. 23 can attain desired characteristics for the following reasons:

(1) Likewise to the case of FIG. 14, the input threshold voltage V$_{ith}$ of the level converter 201 can be set at 1.09 to 1.15 volt.

(2) Likewise to the case of FIG. 14, the switching times for the charge and discharge of the output capacitance C$_s$ or the propagation delay times can be shortened, and the output capacitance-dependencies of the propagation delay times can be lessened.

(3) Likewise to the case of FIG. 14, the storage times of the transistors Q$_1$, Q$_2$ can be shortened.

(4) When the collector potential of the driver transistor Q$_2$ rises to operate the charging output transistor Q$_3$ so as to switch from "off" into "on", the CMOS inverter M$_{p14}$, M$_{n14}$ amplifies the change of the collector potential of the transistor Q$_2$ and transmits the amplified signal to the base of the transistor Q$_3$. Moreover, since the gate input impedances of the MOSFETs M$_{p14}$, M$_{n14}$ are very high, a large base current is inhibited from directly flowing from the collector of the transistor Q$_2$ into the base of the transistor Q$_3$. Therefore, the switching speed of the output transistor Q$_3$ can be enhanced.

Figure 24:
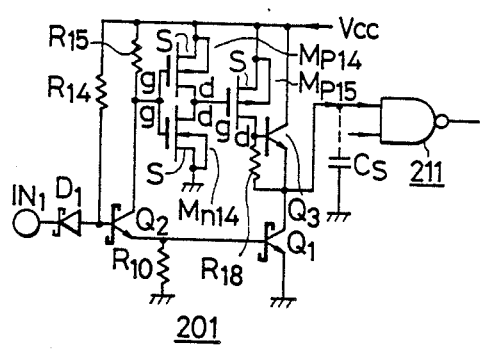

The level converter 201 of FIG. 24 differs from that of FIG. 23 only in that the resistor of 10 kiloohms R$_{18}$ for discharging the base charges of the charging output transistor Q$_3$ is connected between the base and emitter of the transistor Q$_3$. Regarding such level converter 201 in FIG. 24, the propagation delay times and their output capacitance-dependencies have been confirmed as follows:

| | |
|---|---|
| t$_{pHL}$ (for C$_s$ = 0 pF) | 6.2 nsec |
| t$_{pLH}$ (for C$_s$ = 0 pF) | 4.9 nsec |
| K$_{HL}$ | 0.4 nsec/pF |
| K$_{LH}$ | 0.4 nsec/pF |

Further, the level converter 201 in FIG. 24 can attain desired characteristics for reasons similar to those in the case of FIG. 23.

Figure 25:
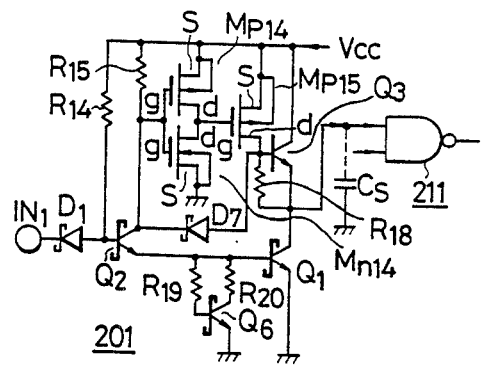

The level converter 201 of FIG. 25 differs from that of FIG. 24 only in that the resistor R$_{10}$ of the base charge discharging circuit of the discharging output transistor $Q_1$ is replaced with an active pull-down circuit which is constructed of a resistor of 1.5 kiloohm $R_{19}$, a resistor of 3 kiloohms $R_{20}$ and a clamped transistor $Q_6$, and that a Schottky barrier diode $D_7$ for discharging the base charges of the charging output transistor $Q_3$ is connected between the base of the transistor $Q_3$ and the collector of the transistor $Q_2$. Regarding such arrangement of FIG. 25, the propagation delay times and their output capacitance-dependencies have been confirmed as follows:

| | |
|---|---|
| $t_{pHL}$ (for $C_s = 0$ pF) | 6.6 nsec |
| $t_{pLH}$ (for $C_s = 0$ pF) | 5.3 nsec |
| $K_{HL}$ | 0.4 nsec/pF |
| $K_{LH}$ | 0.4 nsec/pF |

Further, the level converter 201 in FIG. 25 can attain desired characteristics for reasons similar to those in the case of FIG. 23.

Figure 26:
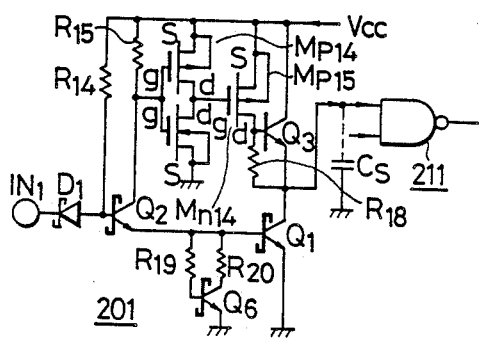

The level converter 201 of FIG. 26 differs from that of FIG. 24 only in that the discharging resistor $R_{10}$ is replaced with the same active pull-down circuit as the active pull-down circuit $R_{19}$, $R_{20}$, $Q_6$ in FIG. 25. Regarding such arrangement of FIG. 26, the propagation delay times and their output capacitance-dependencies have been confirmed as follows:

| | |
|---|---|
| $t_{pHL}$ (for $C_s = 0$ pF) | 8.62 nsec |
| $t_{pLH}$ (for $C_s = 0$ pF) | 4.7 nsec |
| $K_{HL}$ | 0.4 nsec/pF |
| $K_{LH}$ | 0.4 nsec/pF |

Further, the level converter 201 in FIG. 26 can attain desired characteristics for reasons similar to those in the case of FIG. 23.

Figure 27:
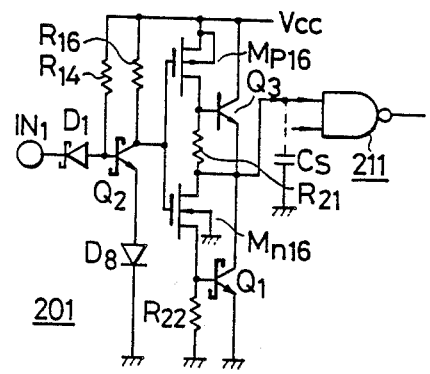

In the level converter 201 of FIG. 27, the bipolar transistors $Q_1$, $Q_2$ and $Q_3$ are respectively the discharging output transistor, driver transistor and charging output transistor. $D_1$ and $D_8$ indicate the Schottky barrier diode for level shift and a P-N junction diode, respectively. $R_{14}$, $R_{16}$, $R_{21}$ and $R_{22}$ indicate resistors of 20 kiloohms, 8 kiloohms, 10 kiloohms and 10 kiloohms, respectively. $M_{p16}$ and $M_{n16}$ indicate a P-channel MOS FET and an N-channel MOS FET respectively, and both ratios W/L of the two FETs $M_{p16}$ and $M_{n16}$ are set at equal values of 32/3.

In particular, the embodiment is characterized in that the transistors $M_{p16}$, $M_{n16}$, $Q_1$ and $Q_3$ constitute an amplifier of the quasi-CMOS inverter type of low output resistance.

The propagation delay times and their output capacitance-dependencies of such level converter 201 in FIG. 27 have been confirmed as follows:

| | |
|---|---|
| $t_{pHL}$ (for $C_s = 0$ pF) | 5.48 nsec |
| $t_{pLH}$ (for $C_s = 0$ pF) | 5.23 nsec |
| $K_{HL}$ | 0.37 nsec/pF |
| $K_{LH}$ | 0.38 nsec/pF |

Further, the level converter 201 in FIG. 27 can attain desired characteristics for reasons stated below.

(1) The forward voltage $V_{F1}$ of the Schottky barrier diode $D_1$ is set at 0.35 to 0.41 volt, the base-emitter voltage $V_{BE2}$ of the transistor $Q_2$ and 0.75 volt, and the forward voltage $V_{F8}$ of the P-N junction diode $D_8$ at 0.75 volt. Therefore, the input threshold voltage $V_{ith}$ of the level converter 201 concerning the on-off operation of the transistor $Q_2$ is set as follows:

$$V_{ith} = -V_{F1} + V_{BE2} + V_{F8}$$
$$= 1.09 \text{ to } 1.15 \text{ volt}$$

(2) The output transistors $Q_1$, $Q_3$ for executing the charge or discharge of the output capacitance $C_s$ are formed of the bipolar transistors of low output resistances. Therefore, the switching operation speeds can be enhanced or the propagation delay times can be shortened, and the output capacitance-dependencies of the propagation delay times can be lessened.

(3) Since the transistors $Q_1$, $Q_2$ are clamped transistors, their storage times can be shortened.

(4) Since the change of the collector potential of the driver transistor $Q_2$ is amplified and then transmitted to the output end by the quasi-CMOS inverter $M_{p16}$, $M_{n16}$, $Q_3$, $Q_1$, the changing speed of an output waveform can be enhanced.

Figure 28:
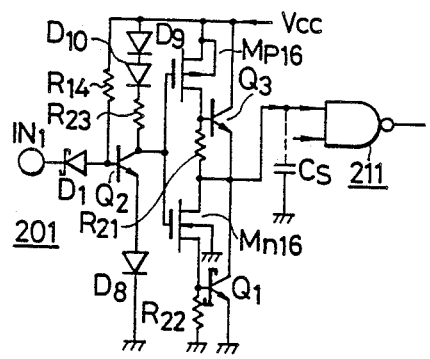

The level converter 201 of FIG. 28 differs from that of FIG. 27 only in that the collector load of the transistor $Q_2$ is not formed of the resistor $R_{16}$, but is formed of P-N junction diodes $D_9$, $D_{10}$ and a resistor of 5 kiloohms $R_{23}$. The propagation delay times and their output capacitance-dependencies of such level converter in FIG. 28 have been confirmed as follows:

| | |
|---|---|
| $t_{pHL}$ (for $C_s = 0$ pF) | 6.66 nsec |
| $t_{pLH}$ (for $C_s = 0$ pF) | 4.16 nsec |
| $K_{HL}$ | 0.42 nsec/pF |
| $K_{LH}$ | 0.37 nsec/pF |

Further, the level converter 201 in FIG. 28 can attain desired characteristics for reasons similar to those in the case of FIG. 27.

Figure 29:
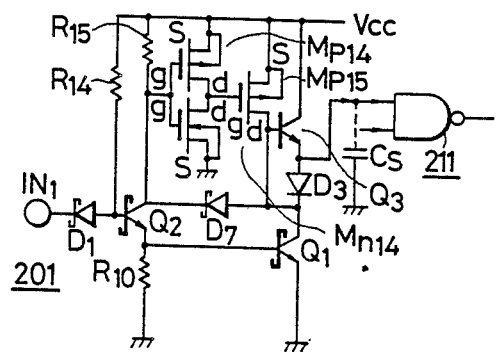

The level converter 201 of FIG. 29 differs from that of FIG. 23 only in the point of connecting the P-N junction diode $D_3$ for reliably turning "off" the transistor $Q_3$ and in the point of connecting the Schottky barrier diode $D_7$ for discharging the base charges of the transistor $Q_3$. Regarding such level converter 201 in FIG. 29, the propagation delay times and their output capacitance-dependencies have been confirmed as follows:

| | |
|---|---|
| $t_{pHL}$ (for $C_s = 0$ pF) | 1.72 nsec |
| $t_{pLH}$ (for $C_s = 0$ pF) | 5.44 nsec |
| $K_{HL}$ | 0.32 nsec/pF |
| $K_{LH}$ | 0.29 nsec/pF |

Further, the level converter 201 in FIG. 29 can attain desired characteristics for reasons similar to those in the case of FIG. 23.

Figure 30:
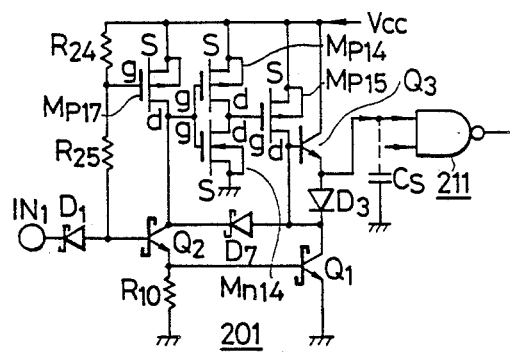

The level converter 201 of FIG. 30 differs from that of FIG. 29 only in that the resistor $R_{14}$ in FIG. 29 is substituted by a resistor of 25 kiloohms $R_{24}$ and a resistor of 5 kiloohms $R_{25}$, and that the resistor $R_{15}$ is substituted by a P-channel MOS FET $M_{p17}$ whose ratio W/L is set at 24/3. Since the FET $M_{p17}$ operates as the active load element of the transistor $Q_2$, the voltage gain of the amplifier $Q_2$, $M_{p17}$ becomes a very large value. Regarding such arrangement of FIG. 30, the propagation delay times and their output capacitance-dependencies have been confirmed as follows:

| | |
|---|---|
| $t_{pHL}$ (for $C_s = 0$ pF) | 2.2 nsec |
| $t_{pLH}$ (for $C_s = 0$ pF) | 5.2 nsec |
| $K_{HL}$ | 0.4 nsec/pF |
| $K_{LH}$ | 0.3 nsec/pF |

Further, the level converter 201 of FIG. 30 can attain desired characteristics for reasons similar to those in the case of FIG. 23.

Figure 31:
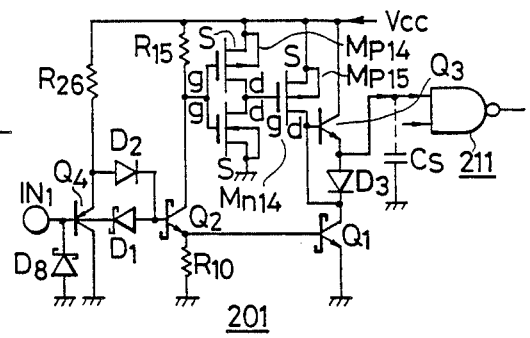

In the level converter 201 of FIG. 31, the transistors $Q_1$ and $Q_2$ are the clamped transistors, the transistor $Q_3$ is the charging output transistor, a transistor $Q_4$ is a P-N-P emitter follower transistor, the diode $D_1$ is the Schottky barrier diode for level shift, the diode $D_2$ is the P-N junction diode for level shift, the diode $D_3$ is the P-N junction diode for reliably turning "off" the transistor $Q_3$, and the diode $D_8$ is the Schottky barrier diode for clamping minus noise at the input terminal. Resistors $R_{10}$, $R_{15}$ and $R_{26}$ are respectively set at 5 kiloohms, 8 kiloohms and 20 kiloohms. The collector signal of the driver transistor $Q_2$ is applied to both the gates of the P-channel MOS FET $M_{p14}$ and N-channel MOS FET $M_{n14}$ which constitute the CMOS inverter serving as the voltage amplifier, and the drain output of which is applied to the gate of the switching P-channel MOS FET $M_{p15}$. The ratios W/L of the FETs $M_{p14}$, $M_{n14}$ and $M_{p15}$ are respectively set at 24/3, 32/3 and 64/3. The drain output of the MOS FET $M_{p15}$ is applied to the base of the bipolar transistor $Q_3$ serving as the charging output transistor.

The propagation delay times and their output capacitance-dependencies of such level converter 201 in FIG. 31 have been confirmed as follows:

| | |
|---|---|
| $t_{pHL}$ (for $C_s = 0$ pF) | 1.94–3.84 nsec |
| $t_{pLH}$ (for $C_s = 0$ pF) | 4.64–5.44 nsec |
| $K_{HL}$ | 0.38 nsec/pF |
| $K_{LH}$ | 0.30 nsec/pF |

Further, the level converter 201 in FIG. 31 can attain desired characteristics for reasons stated below.

(1) the forward voltage $V_{F1}$ of the Schottky barrier diode $D_1$ is 0.35 to 0.41 volt, the forward voltage $V_{F2}$ of the P-N junction diode $D_2$ is approximately 0.75 volt, and the base-emitter voltages $V_{BE1}$, $V_{BE2}$ and $V_{BE4}$ of the respective transistors $Q_1$, $Q_2$ and $Q_4$ are approximately 0.75 volt. Therefore, the input threshold voltage $V_{ith}$ at which the transistors $Q_1$, $Q_2$ are turned "on" becomes as follows:

$$V_{ith} = -V_{BE4} + V_{F2} + V_{BE2} + V_{BE1}$$
$$= 1.5 \text{ volt}$$

(2) The output transistors $Q_1$, $Q_3$ for executing the discharge or charge of the output capacitance $C_s$ are formed of the bipolar transistors of low output resistances. Therefore, the speeds of switching operations can be enhanced or the propagation delay times can be shortened, and the output capacitance-dependencies of the propagation delay times can be lessened.

(3) Since the transistors $Q_1$, $Q_2$ are clamped transistors, their storage times can be shortened.

(4) When the collector potential of the driver transistor $Q_2$ rises to operate the charging bipolar output transistor $Q_3$ to switch from "off" into "on", the CMOS inverter $M_{p14}$, $M_{n14}$ amplifies the change of the collector potential of the transistor $Q_2$ and transmits the amplified signal to the base of the transistor $Q_3$. Moreover, the gate input impedances of the MOS FETs $M_{p14}$, $M_{n14}$ are very high and inhibit the direct flow of a large base current from the collector of the transistor $Q_2$ into the base of the transistor $Q_3$, and a base current is supplied to the base of the transistor $Q_3$ through the low ON-resistance of the FET $M_{p15}$. Therefore, the switching speed of the output transistor $Q_3$ can be enhanced.

Figure 3:
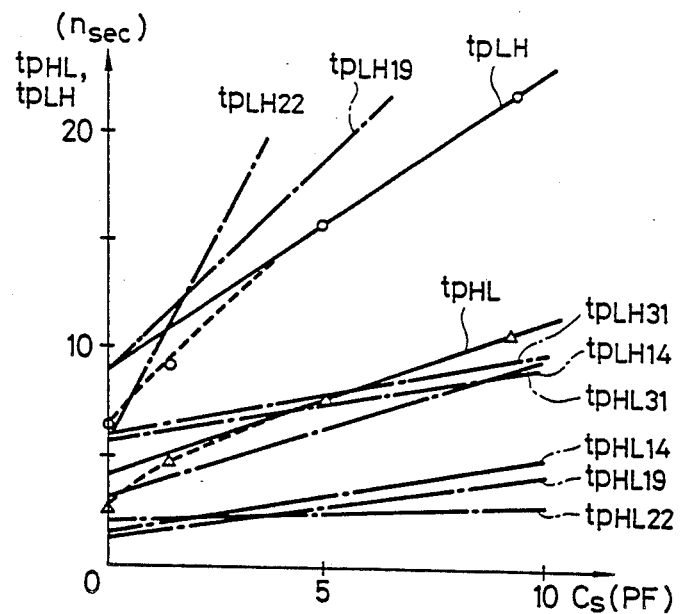
FIG. 3 shows the output capacitance-dependencies of the propagation delay times of the input buffer in FIG. 2.
Figure 4:
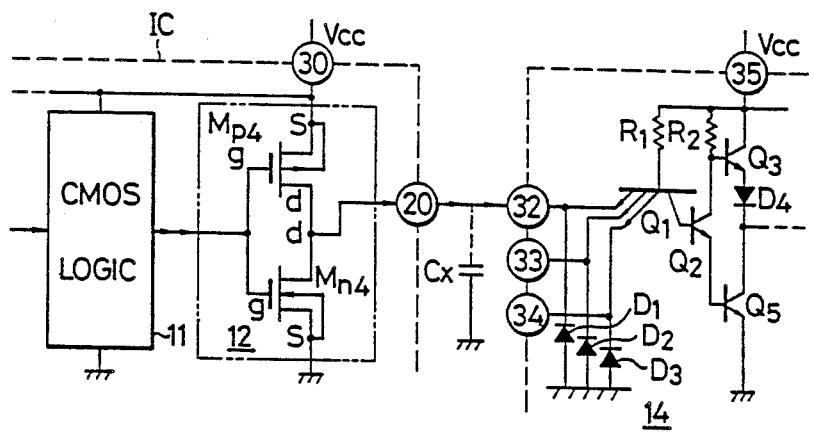
FIG. 4 shows a circuit diagram of an output buffer which was studied by the inventors before the present invention.

FIG. 3 shows with dot-and-dash lines the output capacitance-dependencies of the propagation delay times of the level converters illustrated in FIGS. 14, 19, 22 and 31. It is understood that the output capacitance-dependency of either of the first and second propagation delay times is improved.

There will now be explained the plurality of CMOS—TTL level converters 221, 222, ... 22m of the output buffer 22 in FIG. 6. The essential features of these level converters 221, 222, ... 22m are as stated below.

(1) The input threshold voltage $V_{ith}$ of each of the level converters 221, 222, ... 22m is set between a CMOS low level output voltage of 0.6 volt and high level output voltage of 4.4 volts.

(2) An output transistor, which executes the discharge of the output load capacitance $C_x$ of each of the level converters 221, 222, ... 22m in response to an input signal supplied to the input terminal thereof, is formed of a bipolar transistor.

Further, meritorious features in preferable aspects of performance of the level converters 221, 222, ... 22m of the output buffer 22 are as stated below (noting that the transistors referred to pertain to FIGS. 32 to 34 and 36 which will be described in detail hereinafter).

(3) A high input impedance circuit is connected between the output of the internal logic block 21 and the base of a driver transistor $Q_{11}$ for driving the base of a discharging output transistor $Q_{10}$.

(4) The high input impedance circuit in the above item (3) has the function of logically processing a plurality of output signals from the internal logic block 21.

(5) The discharging output transistor $Q_{10}$ and the driver transistor $Q_{11}$ are formed of clamped transistors provided with Schottky barrier diodes.

(6) An output transistor $Q_{12}$ for charging the output load capacitance $C_x$ is formed of a bipolar transistor.

(7) The level converter has the function of simultaneously turning "off" the discharging output transistor $Q_{10}$ and the charging output transistor $Q_{12}$ in response to a control signal, thereby to control the corresponding output terminal, e. g., $OUT_1$ into a floating state.

(8) The level converters 221, 222, ... 22m are of the open collector output form.

FIGS. 32 to 34 and FIG. 36 show various examples of circuits of the level converter 221 of the output buffer 22 according to embodiments of the present invention. All these level converters have the essential features of the above items (1) and (2). Further, these level converters have at least one of the meritorious features of the above items (3) to (8).

Figure 32:
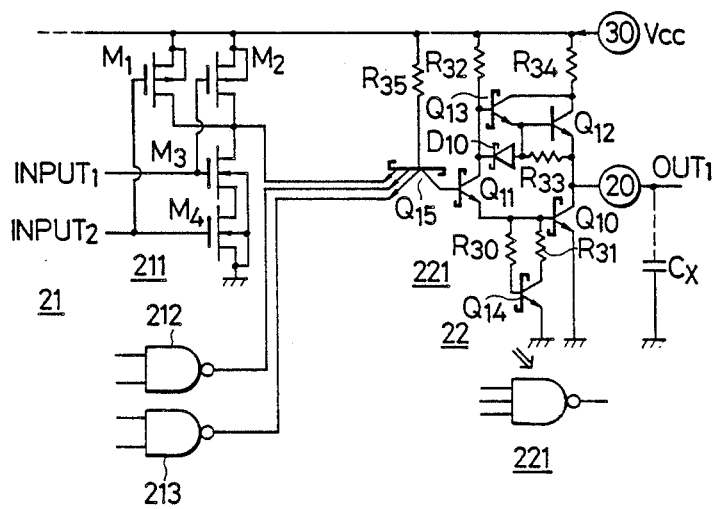
FIGS. 32 to 34 and FIG. 36 show diagrams of various circuits of the level converter 221 of an output buffer 21 according to embodiments of the present invention.
Figure 35:
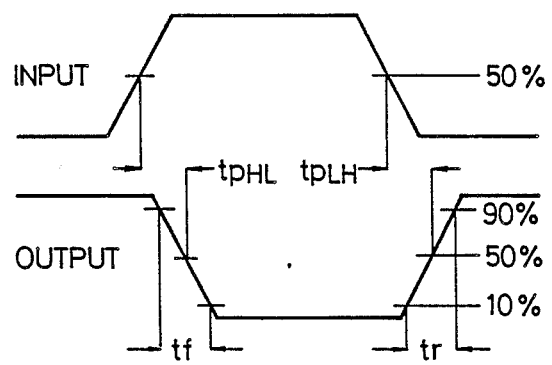
FIG. 35 shows a diagram of input and output waveforms for defining first and second propagation delay times $t_{pHL}$, $t_{pLH}$.

In the level converter 221 of FIG. 32, $Q_{10}$ designates the output transistor for discharging the output load capacitance $C_x$, $Q_{11}$ the driver transistor for driving the transistor $Q_{10}$, $Q_{12}$ the output transistor for charging the output load capacitance $C_x$, and $Q_{13}$ a current amplifying transistor for transmitting the collector signal change of the transistor $Q_{11}$ to the base of the transistor $Q_{12}$. Components $R_{30}$, $R_{31}$ and $Q_{14}$ constitute an active pull-down circuit for discharging the base charges of the transistor $Q_{10}$. $Q_{15}$ indicates a multi-emitter transistor, $R_{32}$ the collector resistor of the transistor $Q_{11}$, $R_{33}$ a resistor for discharging the base charges of the transistor $Q_{12}$, $D_{10}$ a Schottky barrier diode for discharging the base charges of the transistor $Q_{12}$, $R_{34}$ a resistor for limiting the collector currents of the transistors $Q_{12}$ and $Q_{13}$, and $R_{35}$ the base resistor of the transistor $Q_{15}$.

Further, the output of the CMOS.NAND gate 211 of the internal logic block 21, this gate being composed of P-channel MOS FETs $M_1$, $M_2$ and N-channel MOS FETs $M_3$, $M_4$, is applied to the first emitter of the multi-emitter transistor $Q_{15}$; the output of the CMOS.NAND gate 212 is applied to the second emitter of the transistor $Q_{15}$; and the output of the CMOS.NAND gate 213 is applied to the third emitter of the transistor $Q_{15}$. The level converter 221 accordingly has, not only a level converting function, but also a logical processing function as a 3-input NAND gate.

Moreover, the level converter 221 in FIG. 32 can attain desired characteristics for reasons stated below.

(1) The base-emitter voltage $V_{BE15}$ of the transistor $Q_{15}$ is approximately 0.75 volt, the base-collector voltage $V_{BC15}$ of the transistor $Q_{15}$ is approximately 0.55 volt, and the base-emitter voltages $V_{BE10}$ and $V_{BE11}$ of the respective transistors $Q_{10}$ and $Q_{11}$ are approximately 0.75 volt. Therefore, the input threshold voltage $V_{ith}$ of the level converter 221 is set as follows:

$$V_{ith} = -V_{BE15} + V_{BC15} + V_{BE11} + V_{BE10}$$
$$= -0.75 + 0.55 + 0.75 + 0.75$$
$$= 1.3 \text{ volt}$$

(2) The output transistors $Q_{10}$, $Q_{12}$, which execute the discharge or charge of the ouput load capacitance $C_x$ of the level converter 221, are formed of bipolar transistors of low output resistance. Therefore, the speeds of switching operations can be enhanced or the propagation delay times can be shortened, and the output capacitance-dependencies of the propagation delay times can be lessened.

(3) Since the transistors $Q_{10}$, $Q_{11}$, $Q_{13}$, $Q_{14}$ and $Q_{15}$ are the clamped transistors, their storage times can be shortened.

(4) Since the multi-emitter transistor $Q_{15}$ has the logical processing function, the design versatility of the logic semiconductor integrated circuit IC of the master slice type of the gate array type is enhanced.

In such level converter 221 of FIG. 32, however, when the output of the CMOS.NAND gate 211 is at its low level, a relatively large current of 0.4 milliampere continues to flow from the supply voltage $V_{CC}$ to the output end of the CMOS.NAND gate 211 through the resistor $R_{35}$ as well as the base-emitter junction of the transistor $Q_{15}$. Therefore, the ratios W/L of the N-channel MOS FETs $M_3$, $M_4$ of the CMOS.NAND gate 211 must be set at large values of 100/3 so as to lower ON-resistances $R_{ON}$. This incurs lowering in the density of integration of the integrated circuit IC. Moreover, the inventors' study has revealed the problem that, since the gate capacitances of both the MOS FETs $M_3$ and $M_4$ increase, the switching speed of the CMOS.-NAND gate 211 lowers.

Figure 33:
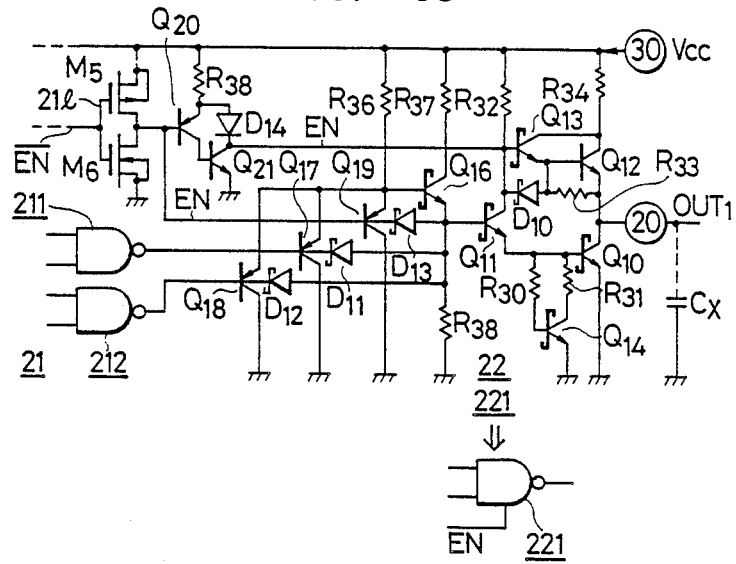

FIG. 33 shows a circuit diagram of the level converter 221 which has been developed in order to solve the problems described above, and in which the multi-emitter transistor $Q_{15}$ in FIG. 32 is substituted by the high input impedance circuit to be explained below.

Referring to FIG. 33, the high input impedance circuit shown there is constructed of P-N-P input transistors $Q_{17}$, $Q_{18}$, an N-P-N emitter follower transistor $Q_{16}$, Schottky barrier diodes $D_{11}$, $D_{12}$ and resistors $R_{36}$, $R_{37}$, $R_{38}$.

Further, the level converter 221 includes a control circuit which is constructed of a P-N-P transistor $Q_{20}$, an N-P-N transistor $Q_{21}$, a P-N junction diode $D_{14}$ and a resistor $R_{38}'$ and which serves to control the output terminal $OUT_1$ into the floating state.

The base of the P-N-P transistor $Q_{20}$ of this control circuit is driven by the enable signal EN of the CMOS inverter 211 in the internal logic block 21, this inverter being composed of a P-channel MOS FET $M_5$ and an N-channel MOS FET $M_6$. The input of such CMOS inverter 211 is supplied with the inverted enable signal $\overline{EN}$.

Further, since this control circuit has been added to the level converter 221, a P-N-P input transistor $Q_{19}$ and a Schottky barrier diode $D_{13}$ are also added to the aforementioned high input impedance circuit.

Accordingly, when the enable signal EN becomes its low level, the transistors $Q_{10}$, $Q_{11}$, $Q_{12}$ and $Q_{13}$ of the level converter 221 turn "off" at the same time, so that the output terminal $OUT_1$ falls into the floating state.

On the other hand, when the enable signal EN becomes its high level, the level converter 221 similarly has a logical processing function as a 2-input NAND gate, so that the design versatility of the integrated circuit IC is enhanced.

Further, the forward voltages $V_{F11}$, $V_{F12}$, $V_{F13}$ of the respective Schottky barrier diodes $D_{11}$, $D_{12}$, $D_{13}$ are 0.35 to 0.41 volt, the base-emitter voltages $V_{BE17}$, $V_{BE18}$, $V_{BE19}$ of the respective P-N-P input transistors $Q_{17}$, $Q_{18}$, $Q_{19}$ are approximately 0.75 volt, and the base-emitter voltages $V_{BE10}$, $V_{BE11}$, $V_{BE16}$ of the respective N-P-N transistors $Q_{10}$, $Q_{11}$, $Q_{16}$ are approximately 0.75 volt. Therefore, the input threshold voltage $V_{ith}$ at which the transistors $Q_{10}$ and $Q_{11}$ turn "on" in relation to, e.g., the output voltage of the CMOS.NAND gate 211 applied to the base of the P-N-P transistor $Q_{17}$ becomes as follows:

$$V_{ith} = -V_{BE17} + V_{BE16} + V_{BE11} + V_{BE10}$$
$$= 1.5 \text{ volt}$$

Moreover, the output transistors $Q_{10}$, $Q_{12}$ for executing the discharge or charge of the output load capacitance $C_x$ are formed of the bipolar transistors of low output resistances. Therefore, the switching speeds can be enhanced or the propagation delay times can be shortened, and the output capacitance-dependencies of the propagation delay times can be lessened. In addition, since the transistors $Q_{10}$, $Q_{11}$, $Q_{13}$, $Q_{14}$ and $Q_{16}$ are the clamped transistors, their delay times can be shortened.

The inventors' study, however, has revealed that, even with the level converter 221 of FIG. 33, an unnegligible current still flows from the base of the P-N-P input transistor $Q_{17}$ to the output end of the CMOS.-NAND gate 221 when the output of this gate 211 is at the low level, so the foregoing problems cannot be perfectly solved.

Figure 34:
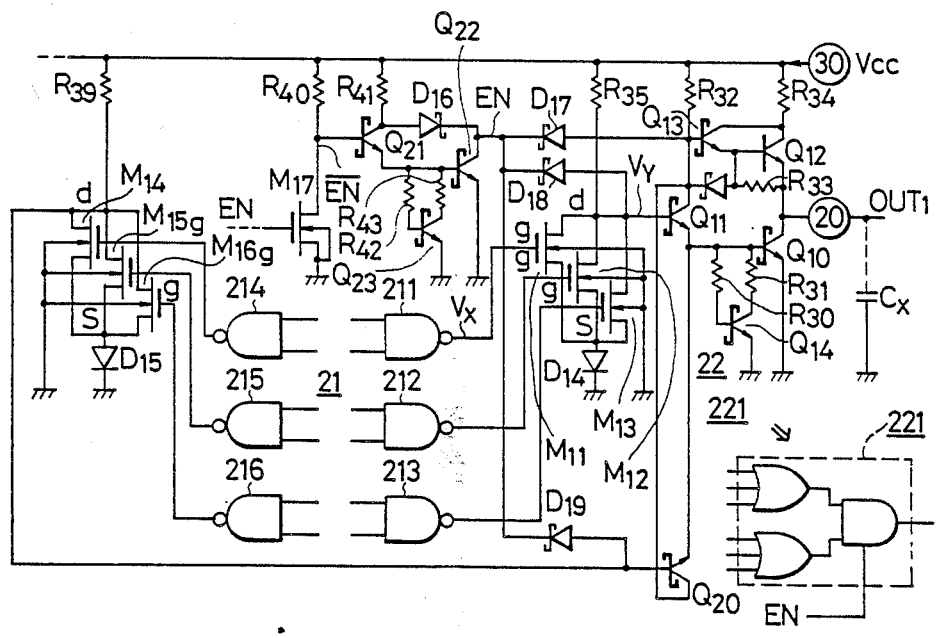

FIG. 34 shows the level converter 221 which has been finally developed in order to solve such problems substantially perfectly. The multi-emitter transistor $Q_{15}$ in FIG. 32 is replaced with the high input impedance circuit which is constructed of MOS FETs as explained below.

Referring to FIG. 34, the high input impedance circuit shown there is contructed of N-channel MOS FETs $M_{11}$, $M_{12}$, $M_{13}$ and a P-N junction diode $D_{14}$. The drain-source paths of the FETs $M_{11}$, $M_{12}$, $M_{13}$ are connected in parallel, and the gates thereof are respectively connected to the CMOS.NAND gates 211, 212, 213 of the internal logic block 21. In addition, the P-N junction diode $D_{14}$ is connected in series with the drain-source paths.

Resistors $R_{30}$, $R_{31}$, $R_{32}$, $R_{34}$ and $R_{35}$ are respectively set at 2 kiloohms, 4 kiloohms, 10 kiloohms, 4 kiloohms, 50–75 ohms and 16 kiloohms. The emitter areas of the transistors $Q_{10}$, $Q_{11}$, $Q_{12}$, $Q_{13}$ and $Q_{14}$ are respectively set at 672 $\mu m^2$, 132 $\mu m^2$, 363 $\mu m^2$, 187 $\mu m^2$ and 242 $\mu m^2$.

Further, in such level converter 221, in order to enhance the logic processing function still more, a second driver transistor $Q_{20}$ which has an emitter area equal to that of the driver transistor $Q_{11}$ is connected in parallel with the transistor $Q_{11}$, and a second high input impedance circuit is disposed which is constructed of N-channel MOS FETs $M_{14}$, $M_{15}$, $M_{16}$, a P-N junction diode $D_{15}$ and a resistor $R_{39}$ likewise to the foregoing high input impedance circuit. This level converter 221 has a logic processing function as a 6-input complex gate circuit.

Further, a control circuit is similarly added to this level converter 221, the control circuit serving to control the output terminal $OUT_1$ into the floating state when the level converter is supplied with the enable signal EN of low level from the internal logic block 21. This control circuit is constructed of an N-channel MOS FET $M_{17}$, transistors $Q_{21}$, $Q_{22}$, $Q_{23}$, resistors $R_{40}$, $R_{41}$, $R_{42}$, $R_{43}$, and Schottky barrier diodes $D_{16}$, $D_{17}$, $D_{18}$, $D_{19}$.

Further, in the level converter 221 of FIG. 34, in order to set input threshold voltages at the respective gates of the six MOS FETs $M_{11}$, ... $M_{16}$ at the middle value of 2.5 volts between the CMOS low level output voltage of 0.6 volt and the CMOS high level output voltage of 4.4 volts, the ratios W/L of the FETs $M_{11}$, ... $M_{16}$ are set as stated below. At this time, the threshold voltages $V_{TH}$ of the FETs $M_{11}$, ... $M_{16}$ are set at approximately 0.75 volt, the forward voltage $V_{F14}$ of the P-N junction diode $D_{14}$ is set at 0.75 volt, and the channel conductances $\beta_0$ of the FETs $M_{11}$, ... $M_{16}$ are set at $60 \times 10^{-6}$ (1/ohm).

A case where only the MOS FET $M_{11}$ is "on" will be considered, and the gate voltage $V_X$, gate-source voltage $V_{GS}$, drain current $I_D$, drain voltage $V_Y$ etc. thereof will be calculated. At this time, the FET $M_1$ is supposed to be biased in its saturation region.

$$V_X = V_{GS} + V_{F14} \quad (1)$$

$$I_D = \frac{\beta_0}{2} \cdot \frac{W}{L} \cdot (V_{GS} - V_{TH})^2 \quad (2)$$

$$V_Y = V_{CC} - R_{35} \cdot I_D \quad (3)$$

From Equations (1) and (2), $$I_D = \frac{\beta_0}{2} \cdot \frac{W}{L} \cdot (V_X - V_{F14} - V_{TH})^2 \quad (4)$$

Considered as the input threshold voltage is the voltage $V_X$ which corresponds to the fact that the voltage $V_Y$ lowers due to a rise in the voltage $V_X$, resulting in the turn-off of the transistors $Q_{10}$, $Q_{11}$.

The drain voltage $V_Y$ at which the transistors $Q_{10}$, $Q_{11}$ turn "off" is evaluated as follows:

$$V_Y = V_{BE11} + V_{BE10} \quad (5)$$

From Equations (3) and (5), $$I_D = \frac{V_{CC} - V_{BE11} - V_{BE10}}{R_{35}} \quad (6)$$

From equations (4) and (6), $$\frac{W}{L} = \frac{V_{CC} - V_{BE11} - V_{BE10}}{R_{35}} \cdot \frac{2}{\beta_0 (V_X - V_{F140} V_{TH})^2} \quad (7)$$

Substituting into Equation (7) the conditions of $V_{CC}$ being 5 volts, $V_{BE11}$ and $V_{BE10}$ being 0.75 volt, $R_{35}$ being 16 kiloohms, $\beta_0$ being $60 \times 10^{-6}$ (1/ohm), $V_X$ being 2.5 volts, $V_{F14}$ being 0.75 volt and $V_{TH}$ being 0.75 volt, $$\begin{aligned}
\frac{W}{L} &= \frac{5 - 0.75 - 0.75}{16 \times 10^3} \cdot \frac{2 \times 10^6}{60} \cdot \frac{1}{(2.5 - 0.75 - 0.75)^2} \\
&= \frac{3.5}{960} \cdot 2 \times 10^3 \cdot \frac{1}{1^2} \\
&= \frac{7}{960} \times 10^3 \\
&= 7.29 \approx \frac{22}{3}
\end{aligned}$$

Thus, the input threshold voltage of the level converter 221 can be set at 2.5 volts by setting the ratios W/L of the FETs $M_{11}$, ... $M_{16}$ at 22/3.

The embodiment of FIG. 34 having the above arrangement has been confirmed by the inventors to exhibit the propagation delay times and the output capacitance-dependencies thereof as listed below.

| | |
|---|---|
| $t_{pHL}$ (for $C_x = 0$ pF) | 8.8 nsec |
| $t_{pLH}$ (for $C_x = 0$ pF) | 7.8 nsec |
| $K_{HL}$ | 0.11 nsec/pF |
| $K_{LH}$ | 0.01 nsec/pF |

Figure 5:
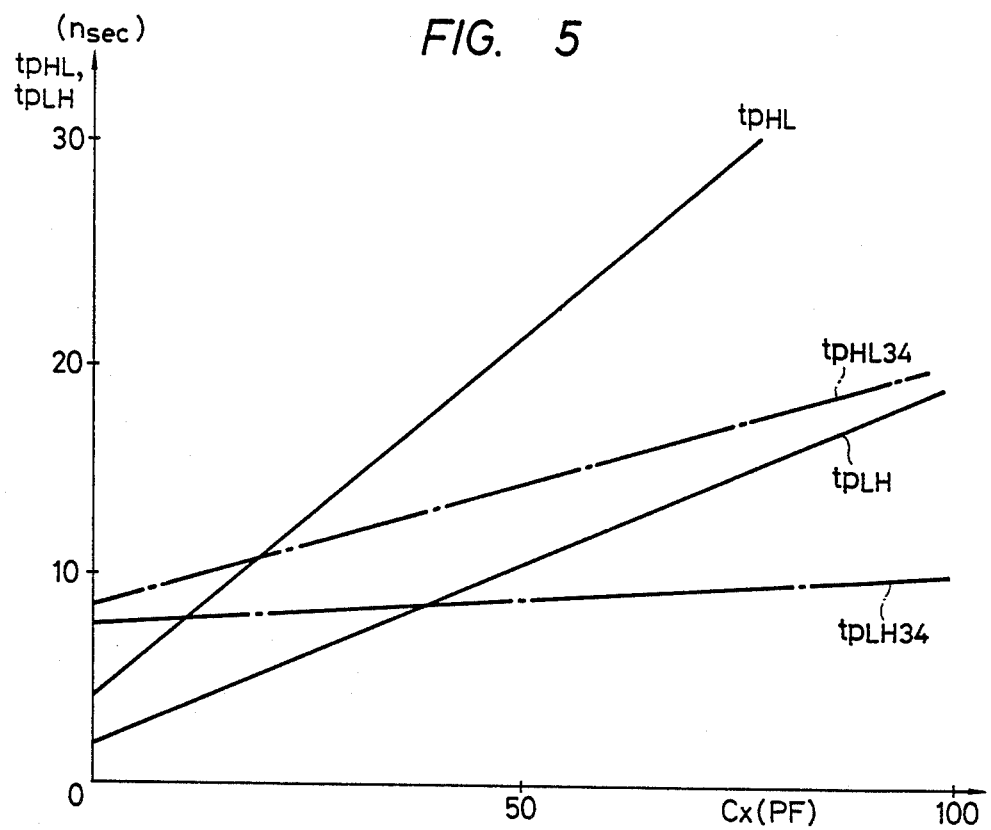
FIG. 5 shows the output load capacitance-dependencies of the propagation delay times of the output buffer in FIG. 4.

FIG. 5 shows with dot-and-dash lines the output load capacitance-dependencies of the propagation delay times of the level converter 221 of the embodiment illustrated in FIG. 34. It is understood that the respective output capacitance-dependencies $K_{HL}$, $K_{LH}$ of the first and second propagation delay times $t_{pHL}$, $t_{pLH}$ are improved.

The level converter 221 in FIG. 34 can attain desired characteristics for reasons stated below.

(1) As described above, the ratios W/L of the MOS FETs $M_{11}$, ... $M_{16}$ are set in correspondence with the supply voltage $V_{CC}$, the resistance $R_{35}$, the channel conductances $\beta_0$ and threshold voltages $V_{TH}$ of the MOS FETs $M_{11}$, ... $M_{16}$, and the forward voltage $V_{F14}$ of the diode $D_{14}$ concerning the base-emitter voltages $V_{BE10}$, $V_{BE11}$ of the transistors $Q_{10}$, $Q_{11}$, whereby the input threshold voltage of the level converter 221 can be set at 2.5 volts which is between 0.6 volt and 4.4 volts.

(2) The output transistors $Q_{10}$, $Q_{11}$ which execute the discharge and charge of the output load capacitance $C_X$ are formed of the bipolar transistors of low output resistances. Therefore, the switching operation speeds can be enhanced or the propagation delay times can be shortened, and the output capacitance-dependencies of the propagation delay times can be lessened.

(3) The high input impedance circuit including the MOS FET $M_{11}$ is connected between the base of the driver transistor $Q_{11}$ and the output of the internal logic block 21. Therefore, current to flow from the gate of the MOS FET $M_{11}$ to the output of the CMOS.NAND gate 211 of the internal logic block 21 can be reduced to a negligible level, and a conspicuous increase in the ratio W/L of the N-channel MOS FETs of the CMOS.-NAND gate 211 can be prevented.

(4) Since the MOS FETs $M_{11}$, $M_{12}$, $M_{13}$ of the high input impedance circuit execute 3-input OR logic, the logical processing function of the level converter 221 is enhanced.

(5) Since also the two driver transistors $Q_{11}$, $Q_{20}$ execute AND logic, the logical processing function of the level converter 221 is further enhanced.

(6) Since the transistors $Q_{10}$, $Q_{11}$, $Q_{13}$, $Q_{14}$, $Q_{20}$ are clamped transistors, their storage times can be shortened.

(7) By bringing the enable signal EN into the low level, the output transistors $Q_{10}$, $Q_{12}$ of the level converter 221 are simultaneously turned "off", so that the output terminal $OUT_1$ falls into the floating state. Thus, in a parallel operation wherein this output terminal $OUT_1$ and the output terminal of another logic circuit, not shown, are connected, the signal level of the output terminal $OUT_1$ can be made independent of the output of the internal logic block 21.

Figure 36:
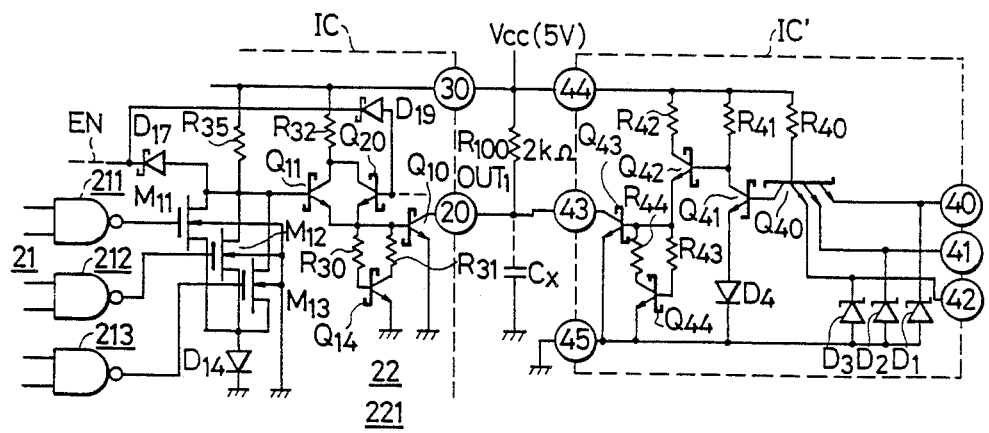

FIG. 36 shows a circuit example of the level converter 221 according to another embodiment of the present invention. The output terminal $OUT_1$ of this level converter is connected in common with the output terminal of another TTL level logic semiconductor integrated circuit IC' of the open collector output type, and the common connection point is connected to the supply voltage $V_{CC}$ of 5 volts through a load resistor of 2 kiloohms $R_{100}$.

Although not especially restricted, the open collector output type TTL level circuit IC' is constructed of Schottky barrier diodes $D_1$, $D_2$, $D_3$, a multi-emitter transistor $Q_{40}$, clamped transistors $Q_{41}$ to $Q_{44}$, resistors $R_{40}$ $R_{44}$, and a P-N junction diode $D_4$. As an open collector output, the collector of the output transistor $Q_{43}$ is connected to terminal No. 43 serving as an output terminal. Inside the circuit IC', however, no circuit element is connected between the supply voltage $V_{CC}$ and the collector of the output transistor $Q_{43}$.

The level converter 221 of FIG. 36 is formed quite similarly to the level converter 221 of FIG. 34 except that, inside the circuit IC, no circuit element is connected between the supply voltage $V_{CC}$ and the collector of the output transistor $Q_{10}$.

Thus, the output terminals of the circuit IC and those of the circuit IC' are connected in the form of the so-called wired OR circuit. In addition, the output transistor $Q_{10}$ of the level converter 221 is forcibly turned "off" by bringing the enable signal EN into the low level, whereby the level of the output terminal $OUT_1$ can be made independent of the output of the internal logic block 21.

Figure 37:
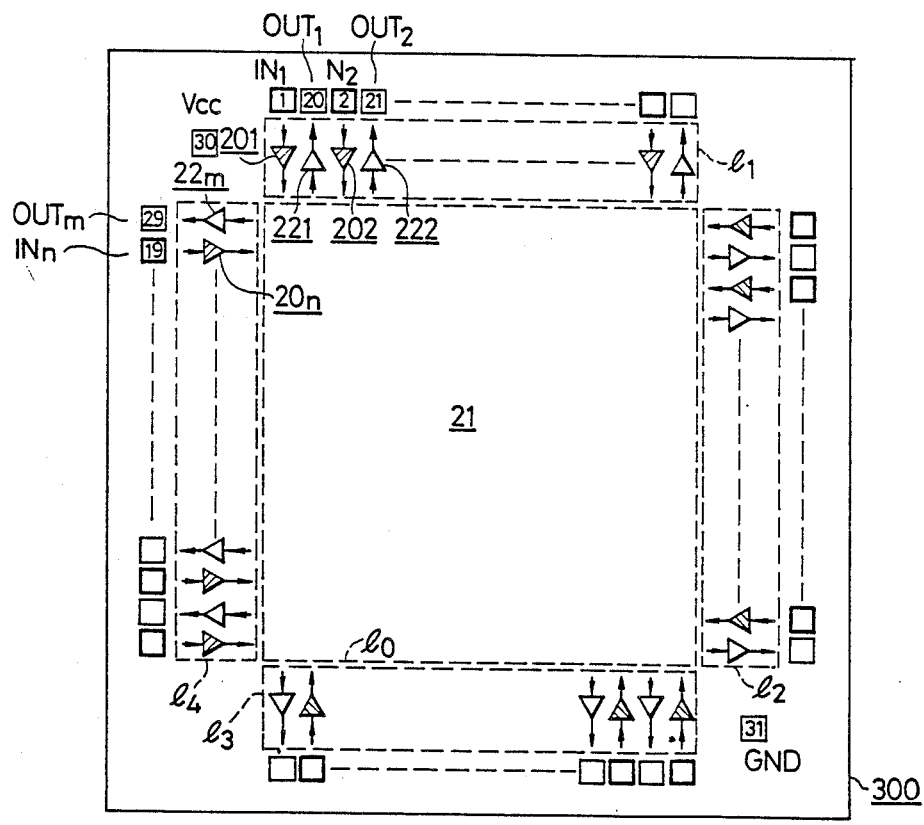
FIG. 37 shows the layout of various circuit blocks on a semiconductor chip surface in a logic semiconductor integrated circuit according to an embodiment of the present invention.

FIG. 37 shows the layout of the various circuit blocks in the front surface of a semiconductor chip of the logic semiconductor integrated circuit IC embodying the present invention.

In the central part (an area enclosed with a broken line $l_0$) of the semiconductor chip 300, the internal logic block 21 formed of the CMOS circuit (pure CMOS circuit or quasi-CMOS circuit) is arranged. In the upper edge part (an area enclosed with a broken line $l_1$) of the semiconductor chip 300, the plurality of input level converters as shown in FIG. 31 (indicated by triangles whose inner parts are hatched) and the plurality of output level converters as shown in FIG. 34 (indicated by triangles whose inner parts are white) are arranged alternately. Likewise, in each of the right edge part (an area enclosed with a broken line $l_2$), the lower edge part (an area enclosed with a broken line $l_3$) and the left edge part (an area enclosed with a broken line $l_4$) of the semiconductor chip 300, the plurality of input level converters as shown in FIG. 31 and the plurality of output level converters as shown in FIG. 34 are arranged alternately.

Above the upper edge part $l_1$, bonding pads for inputs (indicated by squares of thick sold lines) corresponding in number to the input level converters and bonding pads for outputs (indicated by squares of thin solid lines) corresponding in number to the output level converters are arranged . The input parts of the input level converters confront the corresponding input bonding pads, while the output parts thereof confront the internal logic block 21, and the input parts of the output level converters confront the internal logic block 21, while the output parts thereof confront the corresponding output bonding pads.

A plurality of input bonding pads and a plurality of output bonding pads on the right of the right edge part $l_2$, a plurality of input bonding pads and a plurality of output bonding pads below the lower edge part $l_3$, and a plurality of input bonding pads and a plurality of output bonding pads on the left of the left edge part $l_4$ are arranged similarly to the case of the upper edge part $l_1$.

The orientations of the input and output parts of the input level converters and those of the input and output parts of the output level converters in the right edge part $l_2$, lower edge part $l_3$ and left edge part $l_4$ are respectively the same as in the case of the upper edge part $l_1$.

A power source bonding pad 30 for feeding the supply voltage $V_{CC}$ is arranged in at least one of the four corners of the semiconductors chip 300, and a grounding bonding pad 31 for connection to a ground potential point is arranged in at least one of the four corners.

Figure 38:
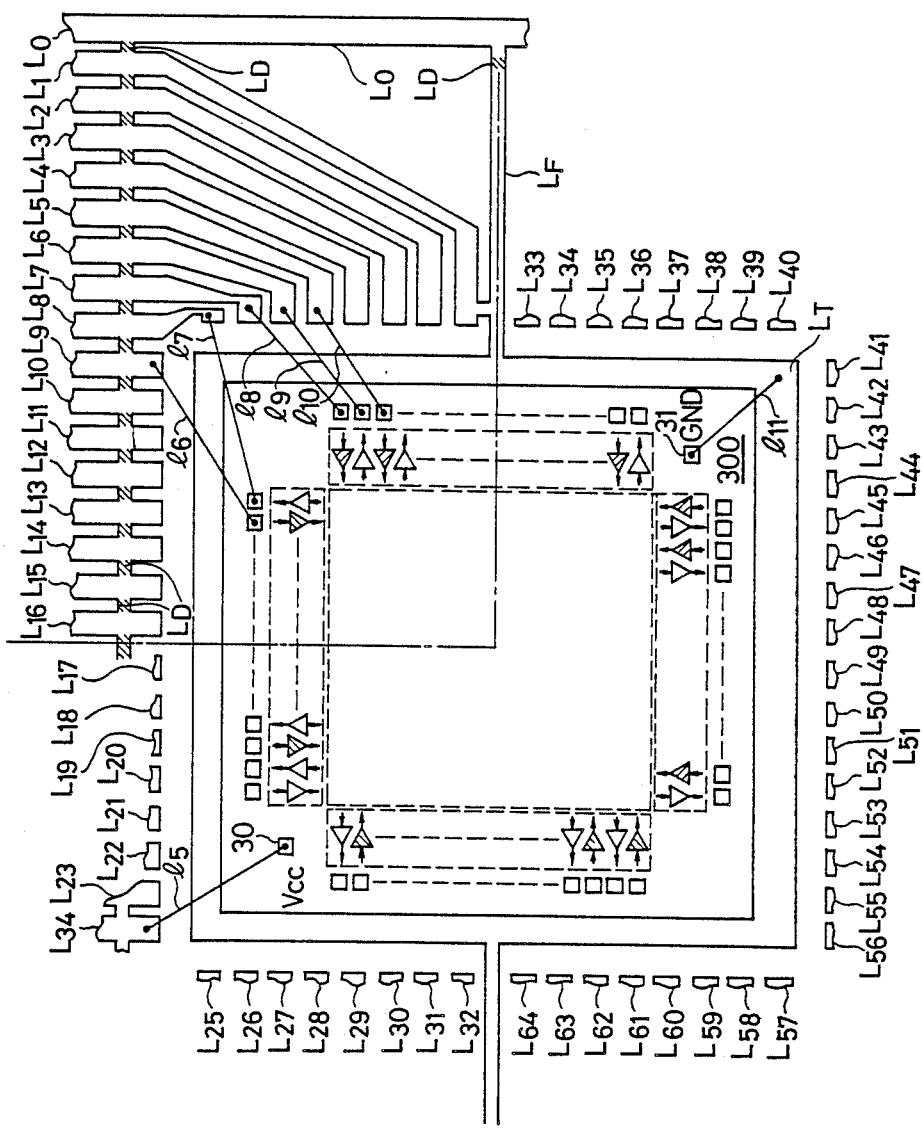
FIG. 38 shows a structural diagram illustrative of the state of connection of a semiconductor chip to the tab lead $L_T$ of a lead frame $L_F$ and connection of bonding wires in a logic semiconductor integrated circuit according to an embodiment of the present invention.

The rear surface of such semiconductor chip of the layout shown in FIG. 37 is connected to the front surface of the tab lead $L_T$ of a metal lead frame $L_F$ in FIG. 38 in physical and electrical close contact.

Referring to FIG. 38, this lead frame $L_F$ has lead portions $L_1$-$L_{16}$, a frame portion $L_0$ and hatched dam portions $L_D$ which correspond to the right upper part of the semiconductor chip 300. In actuality, however, parts corresponding to the right lower part, left lower part and left upper part of the semiconductor chip are similar to the above. Therefore, the lead frame $L_F$ is a worked metal sheet of a structure wherein the frame portions $L_0$, lead portions $L_1$-$L_{64}$ and tab lead $L_T$ are interconnected by the hatched dam portions.

After the rear surface of the semiconductor chip 300 has been connected to the front surface of the tab lead $L_T$, bonding wires (for example, gold wires or aluminum wires) to be described below are wired.

Using wire bonding equipment which is commercially available, the power source bonding pad 30 and the lead portion $L_{34}$ are electrically connected by a wire $l_5$. Further, the input pad and the lead portion $L_9$ are electrically connected by a wire $l_6$, the output pad and the lead portion $L_8$ by a wire $l_7$, the input pad and the lead portion $L_7$ by a wire $l_8$, the output pad and the lead portion $L_6$ by a wire $l_9$, the input pad and the lead portion $L_5$ by a wire $l_{10}$, and the grounding bonding pad 31 and the tab lead $L_T$ by a wire $l_{11}$, in succession.

The lead frame $L_T$ and the semiconductor chip 300 after the completion of the above wiring are put in a metal mold for resin molding, whereupon a liquid resin is poured inside the dam portions $L_D$ of the lead frame $L_F$. Such dam portions $L_D$ hinder the resin from flowing out of them. After the resin has solidified, the lead frame $L_F$, semiconductor chip 300 and resin which form a unitary structure are taken out from the metal mold. Then the dam portions $L_D$ are removed by a press machine or the like, whereby the respective lead portions $L_1$-$L_{64}$ can be electrically isolated.

Figure 39:
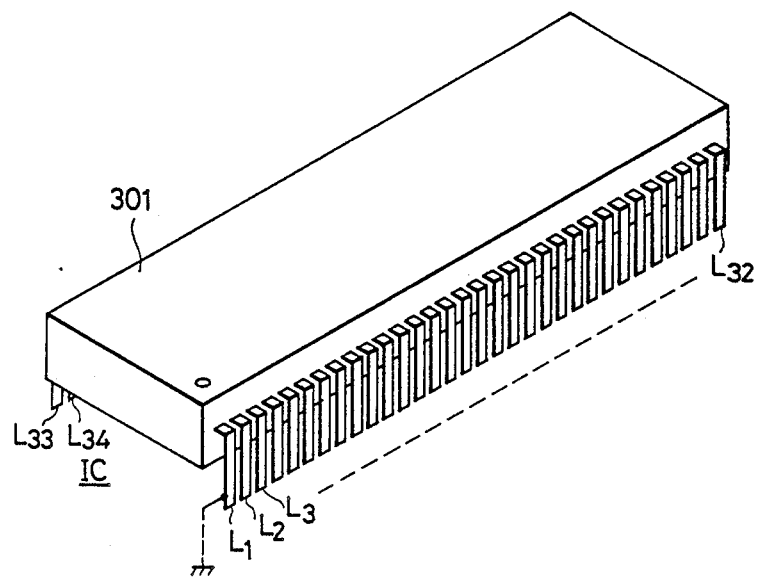
FIG. 39 shows a diagram of the completion of a circuit according to an embodiment of the present invention after resin molding.

If necessary, the leads $L_1$-$L_{64}$ protruding outside the solidified resin are bent downwards. Then, the logic semiconductor integrated circuit IC molded with the resin 301 is finished up as shown in FIG. 39, which shows the completed device. As seen from the figure, such circuit IC is not provided with any special radiation fin for positively radiating heat produced from the semiconductor chip 300, out of the molded structure. If such radiation fin is mounted, the cost of the circuit IC will increase undesirably.

As methods of sealing the semiconductor chip, a ceramic molding method and a method employing a metal case can be used, if desired, instead of the resin molding method stated above. From the viewpoint of the cost of the circuit IC, however, the resin molding method is the most advantageous.

In the logic semiconductor integrated circuit IC according to the embodiment drawn in FIGS. 37 to 39, the total number of the input level converters 201, 202, . . . , 20n constituting the input buffer 20 is 18-50, the total number of the CMOS gates 211, 212, . . . , 21l constituting the internal logic block 21 is 200-1530, and the total number of the output level converters 221, 222, . . . , 22m constituting the output buffer 22 is 18-50, so that the semiconductor chip 300 forms a large-scale semiconductor integrated circuit device. Nevertheless, the circuit IC has been successfully put into the radiation fin-less structure for reasons stated below.

Since the power consumption of each of the CMOS gates 211, 212, . . . , 21l constituting the internal logic block 21 is as slight as 0.039 milliwatt, the power consumption of the whole internal logic block 21 having the 200-1530 gates is as low as 7.8-59.67 milliwatts, which is very low for this number of gates. Since the input level converters 201, 202, . . . , 20n constituting the input buffer 20 according to the embodiment of FIG. 31 include a large number of bipolar transistors, the power consumption per converter is as high as 2.6 milliwatts, and the power consumption of the whole input buffer 20 having the 18-50 converters is as high as 46.8-130 milliwatts. Since also the output level converters 221, 222, . . . , 22m constituting the output buffer 22 according to the embodiment of FIG. 34 include a large number of bipolar transistors, the power consumption per converter is as high as 3.8 milliwatts, and the power consumption of the whole output buffer 22 having the 18-50 converters is as high as 68.4-190 milliwatts.

On the basis of the above data, in the circuit IC which is constructed of the input buffer 20 having the 18 converters, the internal logic block 21 having the 200 gates and the output buffer 22 having the 18 converters, heat of 6.4% with respect to the entire amount of heat is generated in the central part $l_0$ of the front surface of the semiconductor chip shown in FIG. 37, whereas heat of 93.6% is generated in the edge parts $l_1$, $l_2$, $l_3$, $l_4$ in total.

Besides, in the circuit IC which is constructed of the input buffer 20 having the 50 converters, the internal logic block 21 having the 1530 gates and the output buffer 22 having the 50 converters, heat of 15.8% with respect to the entire amount of heat is generated in the central part $l_0$ of the front surface of the semiconductor chip shown in FIG. 37, whereas heat of 84.2% is generated in the edge parts $l_1$, $l_2$, $l_3$ and $l_4$ in total.

As illustrated in FIG. 37, the internal logic block 21 which generates the slight heat is arranged in the central part $l_0$ of the chip, and the input buffer 20 and the output buffer 22 which generates the large quantities of heat are arranged in the edge parts $l_1$, $l_2$, $l_3$ and $l_4$ of the chip. As seen from FIG. 38, therefore, the large quantities of heat in the edge parts $l_1$, $l_2$, $l_3$ and $l_4$ are taken out of the circuit IC (particularly, taken out to the ground line of a printed circuit board when the circuit IC is installed on the printed circuit board) through the tab lead $L_T$ and the lead portion $L_1$ as a grounding lead. Moreover, they can be taken out of the circuit IC (particularly, taken out to the signal lines and power source line of the printed circuit board when the circuit IC is installed on the printed circuit board) through the large number of bonding wires and the lead portions $L_2$, . . . , $L_{64}$.

It has been confirmed by the inventors' computation that, in a case where conversely to the above embodiment, the input buffer 20 and the output buffer 22 which generate the large quantities of heat are arranged in the central part $l_0$ of the chip and the internal logic block 21 is arranged around the central part $l_0$, the large quantities of heat in the central part $l_0$ cannot be readily taken out of the circuit IC.

For the reasons described above, it has been possible to put the circuit IC of the above embodiment into the radiation fin-less structure. In addition, since such circuit IC has been put into the resin-molded structure, it has become possible to sharply reduce the cost of the circuit IC.

Figure 40:
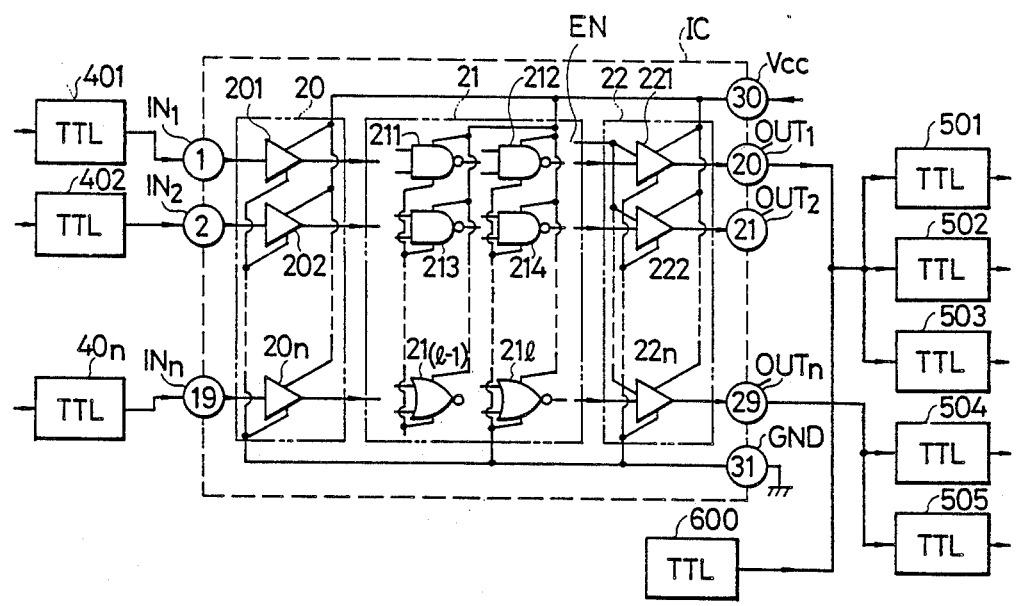
FIG. 40 shows a block diagram of an electronic system constructed in such a way that a circuit according to an embodiment of the present invention and another circuit are packaged on a printed on a printed circuit board.

FIG. 40 shows a block diagram of an electronic system which is constructed by installing on a printed circuit board the logic semiconductor integrated circuit IC according to the embodiment illustrated in FIGS. 37 to 39 and other logic semiconductor integrated circuit devices of TTL levels 401, 402 . . . 40n, 501 to 505 and 600.

Referring to the figure, the outputs of the devices 401, 402 . . . 40n having the TTL level outputs are respectively supplied to the inputs $IN_1$, $IN_2$ . . . $IN_n$ of the circuit IC, the outputs of which are supplied to the inputs of the devices 501, . . . 505 of TTL input levels.

Further, the output $OUT_2$ of the circuit IC and the output of the device 600 are connected in common, whereby both the devices IC and 600 execute a parallel operation.

Heat generated in large quantities in the input buffer 20 and output buffer 22 of the circuit IC can be dissipated to the ground line, power source line, input signal line and output signal line of the printed circuit board.

In addition, when the enable signal EN to be fed to the output buffer 22 is set at the low level, the outputs $OUT_1$, $OUT_2$ ... $OUT_m$ fall into the floating states, and the input levels of the devices 501, 502, 503 are set by the output level of the device 600.

Besides, a high speed is attained at the interface between the input buffer 20 and the devices 401, 402 ... 40n; at the interface between the internal logic block 21 and the input buffer 20; at the interface between the output buffer 22 and the internal logic block 21; and at the interface between the devices 501 ... 505 and the output buffer 20.

According to the foregoing embodiments, favorable effects can be achieved for reasons as stated below.

(1) Output transistors for executing the charge or discharge of the output capacitance $C_s$ of an input level converter 201 are formed of bipolar transistors. Thus, the propagation delay times of the input level converter and the output capacitance-dependencies thereof can be lessened owing to the function that, even when smaller in device size than a MOS FET, the bipolar transistor exhibits a lower output resistance and a higher current gain, so it can produce a great charging current or discharging current.

(2) In the input level converter 201, a Schottky barrier diode for executing a majority carrier operation is connected between the base and collector of a bipolar transistor which is driven into its saturation region. Therefore, the injection of minority carriers from a collector layer into a base layer can be reduced, so that the storage times of the bipolar transistor can be shortened.

(3) In an input level converter 201 according to a preferred embodiment, the base signal or collector signal of a driver transistor $Q_2$ is transmitted to the base of a charging bipolar output transistor $Q_3$ through a MOS buffer which has a high input impedance and a voltage amplifying function. Thus, the operating speed of the output transistor $Q_3$ is enhanced owing to the high input impedance and the voltage amplifying function of the MOS buffer.

(4) In the input level converter 201 according to a preferred embodiment, a P-N-P emitter follower transistor $Q_4$ and a P-N junction diode $D_2$ are connected between an input terminal $IN_1$ and the driver transistor $Q_2$. Thus, the input threshold voltage of the input level converter 201 can be properly set. Moreover, since the input impedance of the P-N-P transistor $Q_4$ at the base thereof is enhanced owing to the current amplifying function thereof, the influence of the output impedance of a TTL level signal source connected to the input terminal $IN_1$ can be reduced.

(5) Output transistors for executing the charge or discharge of the output load capacitance $C_x$ of an output level converter 221 are formed of bipolar transistors. Thus, the propagation delay times of the output level converter and the output capacitance-dependencies thereof can be lessened owing to the function that, even when smaller in device size than a MOS FET, the bipolar transistor exhibits a lower output resistance and a higher current gain, so it can produce a great charging current or discharging current.

(6) In the output level converter 221, a Schottky barrier diode for executing a majority carrier operation is connected between the base and collector of a bipolar transistor which is driven into its saturation region. Therefore, the injection of minority carriers from a collector layer into a base layer can be reduced, so that the storage time of the bipolar transistor can be shortened.

(7) In an output level converter 211 according to a preferred embodiment, a high input impedance MOS circuit is connected between the output of an internal logic block 21 and the base of a driver transistor $Q_{11}$. Thus, current to flow from the gate of the MOS FET of this MOS circuit to the output of the internal logic block 21 can be reduced down to a negligible level. Therefore, lowering in the integration density of the output circuit of the internal logic block 21 and lowering in the switching speed can be prevented.

(8) In the output level converter 221 according to a preferred embodiment, the high input impedance MOS circuit is endowed with the function of logically processing a plurality of output signals of the internal logic block 21. Thus, the design versatility of a logic semiconductor integrated circuit IC of the master slice type or the gate array type can be enhanced.

(9) In the output level converter 221 according to a preferred embodiment, a control circuit for controlling an output terminal $OUT_1$ into a floating state on the basis of an enable signal EN is arranged. Therefore, in a case where this output terminal $OUT_1$ and the output terminal of another logic circuit are connected in common, the level of the common output terminal can be set in accordance with the output of the other logic circuit.

(10) In a preferred embodiment, the internal logic block 21 which is formed of a pure CMOS circuit or a quasi-CMOS circuit thereby to have its power consumption reduced is arranged in the central part of the front surface of a semiconductor chip, while the input level converters 201, ... and the output level converters 221, ... each of which includes a plurality of bipolar transistors and exhibits a high power consumption are arranged in the peripheral edge parts of the front surface of the semiconductor chip. Thus, heat dissipation is facilitated. It has therefore been possible to put the logic semiconductor integrated circuit device IC into a radiation fin-less structure and to curtail the cost thereof.

(11) According to a preferred embodiment, the logic semiconductor integrated circuit device IC is put into a resin-molded structure, and hence, the curtailment of the cost thereof has become possible.

(12) Meanwhile, the input terminal $IN_1$ of the input level converter 201 is not connected to the gate of a MOS FET, but it is connected to the cathode of the Schottky barrier diode $D_1$ or the base of the P-N-P transistor $Q_4$. It has therefore been permitted to enhance the breakdown strength against a surge voltage applied to the input terminal $IN_1$.

While, in the above, the invention made by the inventors has been concretely described in conjunction with the various illustrated embodiments, it is needless to say that the invention is not restricted to the foregoing embodiments but that it can be variously modified and altered within the scope of the claims without departing from the gist thereof.

For example, in FIG. 6, the arrangement can also be such that the level converters 201, 202 ... 20n of the input buffer 20 execute ECL—CMOS level conversion, while the level converters 221, 222 ... 22m of the output buffer 22 execute CMOS—ECL level conversion. It is needless to say that, to this end, the input buffer 20, internal logic block 21 and output buffer 22 may be operated with the ground level and a minus supply voltage $-V_{EE}$. Likewise, in FIG. 6, the arrangement can be such that the level converters 201, 202 ... 20n of the input buffer 20 execute i²L—CMOS level conversion, while the level converters 221, 222 ... 22m of the ouput buffer 22 execute CMOS—i²L level conversion.

Further, in the embodiments of FIGS. 14 to 21, FIGS. 23 to 26 and FIGS. 29 and 30, the P-N-P emitter follower transistor Q4 and the P-N junction diode D2 in FIG. 31 may well be added.

In addition, the reason why the denominator L of the ratio W/L of the MOS FET is set at 3 is that the channel length of the MOS FET is assumed to be 3 μm. since that is a typical conventional value which is practically obtainable with present standard equipment. However, techniques are presently being developed which should ultimately permit channel length L to be fined to 2 μm, 1.5 μm and 1 μm or less owing to improvements in photolithography, and the denominator L of the ratio W/L will become smaller accordingly.

With the fining, the device sizes of bipolar transistors will be reduced more, and changes in the resistances of resistors within circuits will also become necessary.

The method of taking the large number of leads $L_1, \ldots L_{64}$ out of the molding resin 301 is not restricted to the embodiment of FIG. 39, either. It is more appropriate for reducing the size of the lead frame $L_T$ as well as the circuit device IC and attains a higher packaging density on the printed circuit board if the external shape of the molding resin 301 is made a substantially rectangular square, not an oblong, so as to take out the large number of leads $L_1, \ldots L_{64}$ from all four sides.

While, in the above, the invention made by the inventors has been chiefly described for the cases of application to a logic semiconductor integrated circuit device, it is not restricted to these cases.

By way of example, it is needless to say that, not only the input buffer 20, internal logic block 21 and output buffer 22, but also any of a bipolar analog circuit, MOS analog circuit, P-channel MOS logic or N-channel MOS logic i²L circuit, and ECL circuit can be arranged on the semiconductor chip as may be needed.

What is claimed is:

1. A semiconductor integrated circuit comprising:
   (1) an input circuit having input and output terminals, said input circuit performing a switching operation responding to an input signal received at said input terminal and including means for providing an output signal at said output terminal; and
   (2) an internal logic block including a plurality of gate circuits, said internal logic block performing logic operations on input signals received at input terminals of said plurality of gate circuits and generating output signals based upon the logic operations at output terminals of said plurality of gate circuits, wherein said output terminal of said input circuit is commonly connected with input terminals of said plurality of gate circuits in accordance with a predetermined gate array type arrangement, and said means for providing the output signal in said input circuit includes a first bipolar output transistor, a base of which responds to said input signal received at said input terminal, a current flowing through a collector-emitter path of said first bipolar output transistor charging or discharging a capacitance at said output terminal of said input circuit and a second bipolar output transistor, a base of which is supplied with a base drive signal responding to said input signal, a current flowing through a collector-emitter path of said second bipolar output transistor charging or discharging said capacitance, wherein said collector-emitter path of said second bipolar output transistor is connected in series with said collector-emitter path of said first bipolar output transistor between a first and a second operating potential, wherein said charging or discharging operation executed by said second bipolar transistor is opposite to the charging or discharging operation executed by said first bipolar transistor, wherein said input circuit further includes a CMOS buffer circuit, an input of which responds to said input signal and an output of which generates said base drive signal for said second bipolar output transistor, wherein the logic operations of said internal logic block is determined in accordance with the predetermined gate array type arrangement, and wherein said plurality of gate circuits of said internal logic block are formed in accordance with the predetermined gate array type arrangement to include a plurality of quasi-CMOS circuits and a plurality of CMOS circuits, input stages of said quasi-CMOS circuits being composed of P-channel and N-channel MOSFETs and output stages of said quasi-CMOS circuits being composed of bipolar transistors, each of said CMOS circuits including P-channel and N-channel MOSFETs.

2. A semiconductor integrated circuit according to claim 1, wherein said internal logic block further comprises a flip-flop circuit which is constructed by combining a first and a second gate circuit, an output of said first gate circuit being connected to an input of said second gate circuit, an output of said second gate circuit being connected to an input of said first gate circuit, and each of said first and said second gate circuits being constructed of a quasi-CMOS circuit, an input stage of which is composed of p-channel and n-channel MOSFETs and an output stage of which is composed of bipolar output transistors.

3. A semiconductor integrated circuit according to claim 2, wherein each of said first and said second gate circuits is a NAND gate circuit.

4. A semiconductor integrated circuit according to claim 2, wherein each of said first and said second gate circuits is a NOR gate circuit.

5. A semiconductor integrated circuit according to claim 1, wherein said internal logic block further comprises a combination of a first and a second gate circuit, an output of said first gate circuit being connected to an output of said second gate circuit and to an input of another circuit within said semiconductor integrated circuit, wherein said first gate circuit is constructed of a quasi-CMOS circuit, an input stage of which is composed of p-channel and n-channel MOSFETs and an output stage of which is composed of bipolar output transistors, and wherein at least an input stage of said second gate circuit is composed of other p-channel and n-channel MOSFETs.

6. A semiconductor integrated circuit according to claim 5, wherein said another circuit generates an output signal at an external output terminal of said semiconductor integrated circuit.

7. A semiconductor integrated circuit according to claim 6, wherein at least an output stage of said another circuit is composed of bipolar output transistors.

8. A semiconductor integrated circuit comprising;

(1) an internal logic block including a plurality of MOS gate circuits, said internal logic block performing logic operations on input signals received at input terminals of said plurality of MOS gate circuits and generating output signals based upon the logic operations at output terminals of said plurality of MOS gate circuits, wherein the logic operation of the internal logic block is determined in accordance with a predetermined gate array type arrangement; and (2) an output circuit having input and output terminals, said output circuit performing a switching operation responding to an input signal received at said input terminal of said output circuit and including means for providing an output signal at said output terminal of said output circuit, wherein at least one of said output termnals of said plurality of MOS gate circuits is connected with said input terminal of said output circuit in accordance with the predetermined gate array type arrangement, said output terminal of said output circuit is connected with at least one of terminals of another device outside said semiconductors integrated circuit and said means for providing the output signal in said output circuit includes a first bipolar output transistor, a base of which responds to said input signal received at said input terminal of said output circuit, a current flowing through a collector-emitter path of said first bipolar output transistor charging or discharging a load capacitance at said output terminal of said output circuit, wherein said output circuit further comprises a MOS circuit which is connected between the base of said first bipolar output transistor and one of said output terminals of said internal logic block wherein said output circuit further comprises a Schottky barrier diode which is connected between said base and said collector of the first bipolar output transistor, and wherein said plurality of MOS gate circuits of said internal logic block are formed in accordance with the predetermined gate array type arrangement to be constructed of quasi-CMOS circuits, input stages of which are composed of p-channel and n-channel MOSFETs and output stages of which are composed of bipolar transistors.

9. A semiconductor integrated circuit according to claim 8, wherein said output circuit includes a plurality of input terminals coupled to receive a plurality of output signals of said internal logic block, wherein said MOS circuit is connected between said base of said first bipolar output transistor and a plurality of output terminals of said internal logic block, and wherein said MOS circuit includes means for logically processing said plurality of output signals of said internal logic block.

10. A semiconductor integrated circuit comprising;
(1) an internal logic block including a plurality of MOS gate circuits, said internal logic block performing logic operations on input signals received at input terminals of said plurality of MOS gate circuits and generating output signals based upon the logic operations at output terminals of said plurality of MOS gate circuits, wherein the logic operations of the internal logic block is determined in accordance with a predetermined gate array type arrangement; and (2) an output circuit having input and output terminals, said output circuit performing a switching operation responding to an input signal received at said input terminal of said output circuit and including means for providing an output signal at said output terminal of said output circuit, wherein at least one of said output terminals of said plurality of MOS gate circuits is connected with said input terminal of said output circuit in accordance with the predetermined gate array type arrangement, said output terminal of said output circuit is commonly connected with a plurality of terminals of other circuits and said means for providing the output signal in said output circuit includes a first bipolar output transistor, a base of which responds to said input signal received at said input terminal of said output circuit, a current flowing through a collector-emitter path of said first bipolar output transistor charging or discharging a load capacitance at said output terminal of said output circuit, wherein said output circuit further comprises a MOS circuit which is connected between the base of said first bipolar output transistor and one of said output terminals of said internal logic block, and wherein said plurality of MOS gate circuits of said internal logic block are formed in accordance with the predetermined gate array type arrangement so as to be constructed of quasi-CMOS circuits, input stages of which are composed of p-channel and n-channel MOSFETs and output stages of which are composed of bipolar transistors, wherein said internal logic block is arranged in a central part of a semiconductor chip, and wherein said output circuit is arranged at a periphery of said semiconductor chip.

11. A semiconductor integrated circuit according to claim 10, wherein said output circuit includes a plurality of input terminals coupled to receive a plurality of output signals of said internal logic block, wherein said MOS circuit is connected between said base of said first bipolar output transistor and a plurality of output terminals of said internal logic block, and wherein said MOS circuit includes means for logically processing a plurality of output signals of said internal logic block.

12. A semiconductor integrated circuit comprising:
(1) a plurality of input circuits, each of said input circuits having input and output terminals, performing a switching operation responding to an input signal received at said input terminal and including means for providing an output signal at said output terminal; and (2) an internal logic block including a plurality of gate circuits, said internal logic block performing logic operations on input signals received at input terminals of said plurality of gate circuits and generating output signals based upon the logic operations at output terminals of said plurality of gate circuits, wherein the logic operations of the internal logic block are determined in accordance with the gate array type arrangement, wherein the output terminal of one of said plurality of input circuits is connected with a predetermined plurality of said input terminals of said plurality of gate circuits in accordance with the predetermined gate array type arrangement, said means for providing the output signal in said one of said plurality of input circuits includes a first bipolar output transistor, a base of which responds to said input signal received at said input terminal of said one of said plurality of input circuits, a current flowing through a collector-emitter path of said first bipolar output transistor charging or discharging a capacitance of said output terminal of said one of said plurality of input circuits, wherein said plurality of gate circuits of said internal logic block are formed in accordance with the predetermined gate array type arrangement so as to be constructed of quasi-CMOS circuits, the input stages of which are composed of p-channel and n-channel MOSFETs and the output stages of which are composed of bipolar transistors, wherein said means for providing the output signal in said one of said plurality of input circuits further comprises a second bipolar output transistor, a base of which is supplied with a base drive signal responding to said input signal received at said input terminal of said one of said plurality of input circuits, a current flowing through a collector-emitter path of said second bipolar output transistor charging or discharging said capacitance, wherein said collector-emitter path of said second bipolar output transistor is connected in series with said collector-emitter path of said first bipolar output transistor between a first and a second operating potential, wherein said charging or discharging operation executed by said second bipolar transistor is opposite to the charging or discharging operation executed by said first bipolar transistor, and wherein said one of said plurality of input circuits further includes a CMOS buffer circuit, an input of which responds to said input signal and an output of which generates said base drive signal for said second bipolar output transistor, wherein said internal logic block is arranged in a central part of a semiconductor chip, and wherein said input circuits are arranged at a periphery of said semiconductor chip.

13. A semiconductor integrated circuit according to claim 12, wherein wirings between said output terminal of said one of said plurality of input circuits and said predetermined plurality of input terminals of said plurality of gate circuits are connected in accordance with a predetermined master slice type arrangement.

14. A semiconductor integrated circuit according to claim 12, wherein wirings between said output terminal of said one of said plurality of input circuits and said predetermined plurality of input terminals of said plurality of gate circuits are connected in accordance with a predetermined gate array type arrangement.

15. A semiconductor integrated circuit comprising:
(1) a first digital circuit having input and output terminals, performing a digital operation responding to an input signal received at said input terminal and including means for providing an output signal at said output terminal; and
(2) other digital circuits, input terminals of which are coupled to said output terminal of said first digital circuit in accordance with a predetermined gate array type arrangement, said other digital circuits performing digital operations responding to said output signal at said output terminal of said first digital circuit, wherein said means for providing said output signal in said first digital circuit includes a first bipolar output transistor, a base of which responds to said input signal at said input terminal of said first digital circuit, a current flowing through a collector-emitter path of said first bipolar output transistor charging or discharging a capacitance of said output terminal of said first digital circuit, and said other digital circuits include at least one quasi-CMOS circuit and at least one CMOS circuit, said at least one quasi-CMOS circuit including an input stage composed of P-channel and N-channel MOSFETs and an output stage composed of bipolar transistors, said at least one CMOS circuit including a P-channel and N-channel MOSFETs, said quasi-CMOS and CMOS circuits being formed in accordance with said predetermined gate array type arrangement, said first digital circuit further comprising a second bipolar output transistor, a base of which is supplied with a base drive signal in response to said input signal at said input terminal of said first digital circuit, a current flowing through a collector-emitter path of said second bipolar output transistor charging or discharging said capacitance, wherein said collector-emitter path of said scond bipolar output transistor is connected in series with said collector-emitter path of said first bipolar output transistor between a first and a second operating potential, wherein said charging or discharging operation executed by said second bipolar transistor is opposite to the charging or discharging operation executed by said first bipolar transistor, and wherein said first digital circuit further includes a CMOS buffer circuit, an input of which responds to said input signal and an output of which generates said base drive signal for said second bipolar output transistor.

16. A semiconductor integrated circuit formed in accordance with a predetermined gate array arrangement, said semiconductor integrated circuit comprising:
a semiconductor substrate having a main surface;
a plurality of external terminals formed on said main surface;
a plurality of input circuits and a plurality of output circuits formed on said main surface, each said input circuit being coupled to have an input terminal thereof coupled to a selected one of said plurality of external terminals, and each said output circuit being coupled to have an output terminal thereof coupled to a selected one of said plurality of external terminals; and
an internal logic circuit disposed on said main surface in such a manner as to receive at input terminals thereof output signals of said plurality of input circuits and to provide at output terminals thereof output signals that drive input terminals of said plurality of output circuits,
said internal logic circuit including a plurality of logic gates each of which has means for performing a predetermined logical operation, said plurality of logic gates being coupled to one another in accordance with said predetermined gate array arrangement wherein at least one of said plurality of logic gates has an output stage composed of at least one bipolar output transistor for driving an output load capacitance of said at least one logic gate and an input stage composed of P- and N-channel MOSFETs for driving said bipolar output transistor.

17. A semiconductor integrated circuit according to claim 16, wherein said at least one of said plurality of logic gates is a NAND gate.

18. A semiconductor integrated circuit according to claim 16, wherein said at least one of said plurality of logic gates is a NOR gate.

19. A semiconductor integrated circuit according to claim 16, wherein said plurality of external terminals are formed adjacent a peripheral edge of said substrate, wherein said internal logic circuit is formed on said main surface in a central area of said substrate, and wherein said input and output circuits are formed on said main surface between said external terminals and said internal logic circuit.

* * * * *